(12) United States Patent  
Kojo et al.

(10) Patent No.: US 7,904,674 B2
(45) Date of Patent: Mar. 8, 2011

(54) METHOD FOR CONTROLLING SEMICONDUCTOR MEMORY DEVICE

(75) Inventors: Tomoaki Kojo, Kasugai (JP); Masahiro Tanaka, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 479 days.

(21) Appl. No.: 11/984,152

(22) Filed: Nov. 14, 2007

(65) Prior Publication Data

US 2008/0114949 A1 May 15, 2008

(30) Foreign Application Priority Data

Nov. 15, 2006 (JP) ............................. 2006-309262

(51) Int. Cl.
*G06F 12/00* (2006.01)
(52) U.S. Cl. .................. 711/156; 711/103; 711/163; 711/E12.091
(58) Field of Classification Search .................. None
See application file for complete search history.

(56) References Cited

U.S. PATENT DOCUMENTS 5,848,009 A * 12/1998 Lee et al. .................. 365/200
6,353,553 B1 * 3/2002 Tamada et al. ......... 365/185.03
2005/0180209 A1 * 8/2005 Lasser .................. 365/185.03

FOREIGN PATENT DOCUMENTS

JP 2002-118187 A 4/2002
JP 2005-020349 A 1/2005

* cited by examiner

*Primary Examiner* — Shawn X Gu
(74) *Attorney, Agent, or Firm* — Fujitsu Patent Center

(57) ABSTRACT

A semiconductor memory device includes a plurality of independently accessible memory cores. Each memory core includes at least one flag cell storing a flag value and a plurality of data cells storing data. An access control circuit included in the semiconductor memory device selects an access-control subject memory core from the memory cores based on the flag value of the at least one flag cell of each memory core.

13 Claims, 12 Drawing Sheets

Fig.7A

| FC | DC | | | | | | | |
|---|---|---|---|---|---|---|---|---|
| 1 | 0 | 0 | 0 | 0 | 0 | 0 | 0 | 0 | ~M1
| 0 | 0 | 0 | 0 | 0 | 0 | 0 | 0 | 0 | ~M2
| 0 | 0 | 0 | 0 | 0 | 0 | 0 | 0 | 0 | ~M3
| 0 | 0 | 0 | 0 | 0 | 0 | 0 | 0 | 0 | ~M4

Fig.7B

| FC | DC | | | | | | | |
|---|---|---|---|---|---|---|---|---|
| 1 | 1 | 0 | 0 | 1 | 1 | 0 | 1 | 1 | ~M1
| 0 | 0 | 0 | 0 | 0 | 0 | 0 | 0 | 0 | ~M2
| 0 | 0 | 0 | 0 | 0 | 0 | 0 | 0 | 0 | ~M3
| 0 | 0 | 0 | 0 | 0 | 0 | 0 | 0 | 0 | ~M4

Fig.7C

| FC | DC | | | | | | | |
|---|---|---|---|---|---|---|---|---|
| 1 | 1 | 0 | 0 | 1 | 1 | 0 | 1 | 1 | ~M1
| 1 | 0 | 1 | 1 | 1 | 0 | 0 | 0 | 1 | ~M2
| 0 | 0 | 0 | 0 | 0 | 0 | 0 | 0 | 0 | ~M3
| 0 | 0 | 0 | 0 | 0 | 0 | 0 | 0 | 0 | ~M4

Fig.10A

|   | FC1 | FC2 | DC |   |   |   |   |   |   |   |
|---|---|---|---|---|---|---|---|---|---|---|
| M1 | 0 | 0 | 1 | 0 | 0 | 1 | 1 | 0 | 1 | 1 |
| M2 | 0 | 0 | 0 | 0 | 0 | 0 | 0 | 0 | 0 | 0 |
| M3 | 0 | 0 | 0 | 0 | 0 | 0 | 0 | 0 | 0 | 0 |
| M4 | 0 | 0 | 0 | 0 | 0 | 0 | 0 | 0 | 0 | 0 |
| 60 | 0 | 0 | 1 | 0 | 0 | 1 | 1 | 0 | 1 | 1 |

Fig.10B

|   | FC1 | FC2 | DC |   |   |   |   |   |   |   |
|---|---|---|---|---|---|---|---|---|---|---|
| M1 | 1 | 0 | 1 | 0 | 0 | 1 | 1 | 0 | 1 | 1 |
| M2 | 0 | 1 | 0 | 1 | 1 | 1 | 0 | 0 | 0 | 1 |
| M3 | 0 | 0 | 0 | 0 | 0 | 0 | 0 | 0 | 0 | 0 |
| M4 | 0 | 0 | 0 | 0 | 0 | 0 | 0 | 0 | 0 | 0 |
| 60 | 1 | 1 | 0 | 1 | 1 | 1 | 0 | 0 | 0 | 1 |

Fig.10C

|   | FC1 | FC2 | DC |   |   |   |   |   |   |   |
|---|---|---|---|---|---|---|---|---|---|---|
| M1 | 1 | 0 | 1 | 0 | 0 | 1 | 1 | 0 | 1 | 1 |
| M2 | 0 | 1 | 0 | 1 | 1 | 1 | 0 | 0 | 0 | 1 |
| M3 | 0 | 0 | 1 | 1 | 1 | 0 | 1 | 0 | 1 | 1 |
| M4 | 0 | 0 | 0 | 0 | 0 | 0 | 0 | 0 | 0 | 0 |
| 60 | 0 | 0 | 1 | 1 | 1 | 0 | 1 | 0 | 1 | 1 |

Fig.14A

| 0 | 0 | 0 | 0 | 0 | 0 | 0 | 0 | 0 | ~M1 |
|---|---|---|---|---|---|---|---|---|---|
| : | : | : | : | : | : | : | : | : | |
| 0 | 0 | 0 | 0 | 0 | 0 | 0 | 0 | 0 | ~M13 |
| 0 | 0 | 0 | 0 | 0 | 0 | 0 | 0 | 0 | ~M14 |
| 0 | 0 | 0 | 0 | 0 | 0 | 0 | 0 | 0 | ~M15 |
| 1 | 1 | 0 | 0 | 1 | 1 | 0 | 1 | 1 | ~M16 |

Fig.14B

| 0 | 0 | 0 | 0 | 0 | 0 | 0 | 0 | 0 | ~M1 |
|---|---|---|---|---|---|---|---|---|---|
| : | : | : | : | : | : | : | : | : | |
| 0 | 0 | 0 | 0 | 0 | 0 | 0 | 0 | 0 | ~M13 |
| 0 | 0 | 0 | 0 | 0 | 0 | 0 | 0 | 0 | ~M14 |
| 0 | 1 | 1 | 0 | 1 | 0 | 1 | 1 | 1 | ~M15 |
| 1 | 1 | 0 | 0 | 1 | 1 | 0 | 1 | 1 | ~M16 |

Fig.14C

| | 0 | 0 | 0 | 0 | 0 | 0 | 0 | 0 | 0 | ~M1 |
|---|---|---|---|---|---|---|---|---|---|---|---|
| | : | : | : | : | : | : | : | : | : | |
| | 0 | 0 | 0 | 0 | 0 | 0 | 0 | 0 | 0 | ~M13 |
| Read Start Position → | 1 | 1 | 0 | 0 | 0 | 1 | 1 | 1 | 0 | ~M14 |
| | 0 | 1 | 1 | 0 | 1 | 0 | 1 | 1 | 1 | ~M15 |
| Read End Position → | 1 | 1 | 0 | 0 | 1 | 1 | 0 | 1 | 1 | ~M16 | ially, the capacity of a non-volatile semiconductor
METHOD FOR CONTROLLING SEMICONDUCTOR MEMORY DEVICE

CROSS-REFERENCE TO RELATED APPLICATIONS

This application is based upon and claims the benefit of priority from the prior Japanese Patent Application No. 2006-309262, filed on Nov. 15, 2006, the entire contents of which are incorporated herein by reference.

BACKGROUND

1. Field

It is related to a semiconductor memory device and a method for controlling a semiconductor memory device.

2. Description of the Related Art

A semiconductor integrated circuit typically includes a non-volatile semiconductor memory device, such as an EEPROM (electrically erasable programmable ROM) and a flash memory, for storing various setting values. For example, Japanese Laid-Open Patent Publication No. 2005-20349 describes a semiconductor integrated circuit that writes adjustment data to a rewritable non-volatile memory (refer to FIG. 1 of the publication).

A non-volatile semiconductor memory device must include circuits for erasing data, such as a circuit for applying negative voltage and a circuit for applying erasure voltage. For example, Japanese Laid-Open Patent Publication No. 2002-118187 describes a conventional non-volatile memory (refer to FIG. 5 of the publication). The conventional non-volatile memory is coupled to word lines W1 to W4, which form a memory array. The non-volatile memory includes a negative voltage application circuit NEG and an erasure voltage application circuit ED. The negative voltage application circuit NEG applies negative voltage to each of the word lines W1 to W4 during data erasure. The erasure voltage application circuit ED applies positive voltage to memory cells M1 to M16 during data erasure. Each of the memory cells M1 to M16 has a floating gate. To erase data from the memory cells M1 to M16, negative voltage is applied to the control gate of each of the memory cells M1 to M16 and positive voltage is applied to the source of each of the memory cells M1 to M16. A potential difference between the positive voltage and the negative voltage applied to the control gate and the source of each memory cell causes electrons, which are held in the floating gate of each memory cell, to move to the source region through Fowler-Nordheim tunneling.

The capacity of a memory mounted on a large-scale integrated (LSI) circuit is set in accordance with the amount of data that is stored. The amount of the data, such as mode setting values for the LSI circuit and clock frequency setting values for a phase-locked loop (PLL) circuit is normally small. Thus, the capacity of a non-volatile semiconductor memory device may be small. However, the conventional non-volatile semiconductor memory device described above includes the negative voltage application circuit NEG and the erasure voltage application circuit ED, which are used to erase data. The negative voltage application circuit NEG incorporates a capacitor and thus has a large circuit size. In other words, the negative voltage application circuit occupies a large portion of the entire circuit area for the non-volatile semiconductor memory device. Since the negative voltage application circuit occupies a large area, the non-volatile semiconductor memory device cannot be miniaturized and power consumption cannot be reduced.

SUMMARY

The embodiment provides a semiconductor memory device enabling reduction in circuit size.

The embodiment provides a semiconductor memory device including a plurality of memory cores, each of which includes a plurality of non-volatile memory cells that allow only a predetermined logic value to be written and each of which is independently accessible. An access control circuit selects an access-control subject memory core from the plurality of memory cores. The plurality of non-volatile memory cells of each memory core include at least one flag cell storing a flag value and a plurality of data cells storing data. The access control circuit selects the access-control subject memory core based on the flag value of the at least one flag cell.

Other embodiments and advantages will become apparent from the following description, taken in conjunction with the accompanying drawings, illustrating by way of example the principles of the invention.

BRIEF DESCRIPTION OF THE DRAWINGS

The objects and advantages may best be understood by reference to the following description of the presently preferred embodiments together with the accompanying drawings in which:

FIG. 7A is a chart illustrating the setting of flag cells in the second embodiment;

FIG. 7B is a chart illustrating the setting of the flag cells in the second embodiment;

FIG. 7C is a chart illustrating the setting of the flag cells in the second embodiment;

FIG. 10A is a chart illustrating the setting of first and second flag cells shown in FIG. 8;

FIG. 10B is a chart illustrating the setting of the first and second flag cells shown in FIG. 8;

FIG. 10C is a chart illustrating the setting of the first and second flag cells shown in FIG. 8;

FIG. 14A is a chart illustrating the setting of flag cells shown in FIG. 11;

FIG. 14B is a chart illustrating the setting of the flag cells shown in FIG. 11;

FIG. 14C is a chart illustrating the setting of the flag cells shown in FIG. 11;

DETAILED DESCRIPTION OF THE PREFERRED EMBODIMENTS

Figure 1:
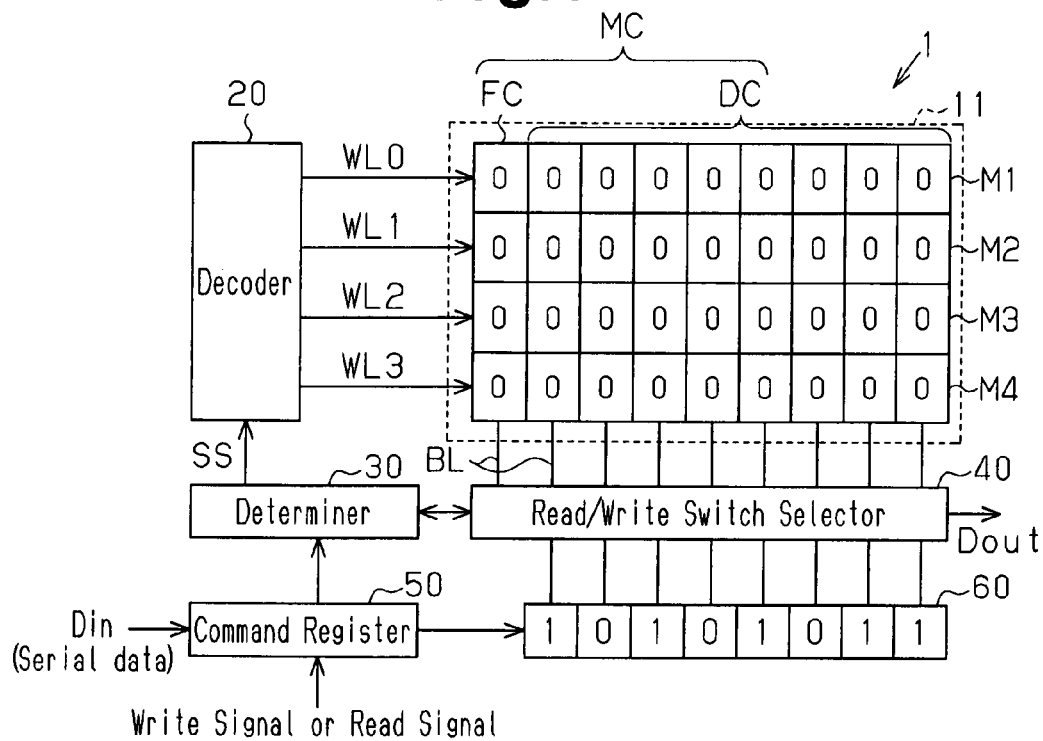
FIG. 1 is a schematic block diagram of a semiconductor memory device according to a first embodiment.

In the drawings, like numerals are used for like elements throughout.

A semiconductor memory device 1 according to a first embodiment will now be described in detail with reference to FIGS. 1 to 4.

As shown in FIG. 1, the semiconductor memory device 1 includes a memory unit 11, a decoder 20, a determiner 30, a read/write switch selector (hereafter referred to as a "switch selector") 40, a command register 50, and a data register 60.

The memory unit 11 includes a large number of memory cells MC, which are arranged in a matrix. The memory unit 11 includes a plurality of (four in FIG. 1) memory cores M1 to M4, which are arranged in the column direction of the matrix. Each of the memory cores M1 to M4 includes a plurality of (nine in FIG. 1) memory cells MC, which are arranged in the row direction of the matrix. More specifically, each of the memory cores M1 to M4 is formed by a flag cell FC (the leftmost memory cell in FIG. 1) and a plurality of (eight in FIG. 1) data cells DC. A flag value for switching word lines is written to the flag cell FC of each memory core. The numeral inside each memory cell MC in FIG. 1 indicates the data (bit value) stored in each memory cell MC. The bit value 0 for a data cell DC indicates that the data cell DC is blank. The memory unit 11 of the semiconductor memory device 1 in FIG. 1 is in an initial state, in which all the data cells DC are blank. The bit value 0 (flag value) for a flag cell FC indicates that the memory core including that flag cell FC is accessible. The bit value 1 (flag value) for a flag cell FC indicates that the memory core including that flag cell FC is inaccessible. In the first embodiment, the memory cells MC are non-volatile memory cells, to which only data represented by a predetermined logic value is permitted to be written. For example, the memory cells MC only permit a program operation (e.g., rewriting of the bit value from 0 to 1) and does not permit an erasing operation (e.g., rewriting of the bit value from 1 to 0) to be performed.

The memory cores M1 to M4 are respectively coupled to word lines WL0 to WL3, which extend through the memory unit 11 in the row direction. The word lines WL0 to WL3 are coupled to the decoder 20. Four memory cells MC that are arranged in the column direction are coupled to each bit line BL, which extend through the memory unit 11 in the column direction. The bit lines BL are coupled to the switch selector 40. The numerals 0 to 3 following the alphabets "WL" of the word lines WL0 to WL3 indicate the word line numbers of the word lines WL0 to WL3. For example, the word line number of the word line WL0 is 0.

The determiner 30 is coupled to the decoder 20 and the switch selector 40. The command register 50, which is coupled to the determiner 30, is provided with a write signal or a read signal. The command register 50 is also provided with input data Din, which is serial data formed by a plurality of bits (eight bits in the first embodiment). The command register 50 provides the determiner 30 with a write command or a read command based on the write signal or the read signal. The command register 50 receives the input data Din after receiving the input of the write signal, and then outputs the input data Din to the data register 60 in the order in which the data has been input. When, for example, the data register 60 receives the 8-bit data 11011001 as the input data Din, the data register 60 stores the data in a manner that the highest-order bit of the data is stored in the rightmost register of the data register 60 as shown in FIG. 1. The data register 60 includes a plurality of (eight in FIG. 1) registers, the quantity of which corresponds to the quantity of the data cells DC in each memory core.

The determiner 30 outputs the write command or the read command, which is provided from the command register 50, to the switch selector 40. The determiner 30 provides a selection signal SS for selecting a predetermined word line to the decoder 20 based on the write command or the read command. More specifically, the determiner 30 performs the processing shown in FIG. 2 based on the write command, and performs the processing shown in FIG. 3 based on the read command.

The decoder 20 selects one of the word lines based on the selection signal SS, which is provided from the determiner 30. When one word line is selected during a data write operation, data is written to the data cells DC that are coupled to the selected word line via the corresponding bit lines BL. The determiner 30 controls the switch selector 40 to write "1" to the flag cell FC that is coupled to the selected word line. During a data read operation, data is output from the data cells DC, which are coupled to the selected word line, to the corresponding bit lines BL.

The switch selector 40, which is coupled to the bit lines BL, is coupled to the data register 60 via the bit lines. The switch selector 40 is switched to operate as a write circuit or a read circuit in accordance with a command provided from the determiner 30. More specifically, the switch selector 40 operates as the write circuit in response to a write command and operates as the read circuit in response to a read command. When operating as the write circuit, the switch selector 40 reads data bits stored in the data register 60 via the corresponding bit lines. The switch selector 40 amplifies the data bits, which have been read from the data register 60, using sense amplifiers that are coupled to the bit lines, and writes the amplified data bits to data cells DC that are coupled to the word line selected by the decoder 20.

When operating as the read circuit, the switch selector 40 reads data from the data cells DC that are coupled to the word line selected by the decoder 20 via the corresponding bit lines BL. The switch selector 40 amplifies data read from the data cells DC using sense amplifiers that are coupled to the bit lines BL, and stores the amplified data. The switch selector 40 then sequentially selects the bit lines BL in accordance with clock signals (not shown). The switch selector 40 outputs, as output data Dout, the data held by the sense amplifier that is coupled to each selected bit line BL.

The operation of the semiconductor memory device 1 will now be described with reference to FIGS. 2 to 4.

The data write operation for writing the first 8-bit data 11011001 (first data) to the memory unit 11, which is in the initial state as shown in FIG. 1, will first be described.

In the data write operation, the command register 50 receives a write signal and provides the determiner 30 with a write command in response to the write signal. Next, the command register 50 receives the 8-bit data 11011001, which is input data Din. The command register 50 then provides the data register 60 with the 8-bit data in the order in which the data has been input.

Figure 2:
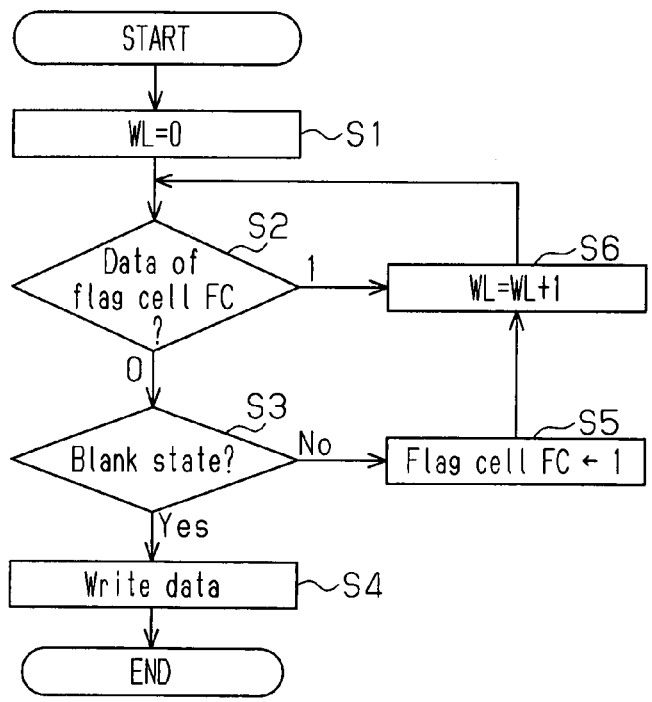
FIG. 2 is a flowchart illustrating a data write operation of the semiconductor memory device of FIG. 1.

Referring to FIG. 2, in step S1, the determiner 30 provides the decoder 20 with a selection signal SS for selecting the word line WL0 in response to the write command, which is generated by the command register 50. The determiner 30 also provides the switch selector 40 with the write command. The decoder 20 selects the word line WL0 in response to the selection signal SS, which is provided from the determiner 30. The switch selector 40 operates as the write circuit in response to the write command.

In step S2, the determiner 30 controls the switch selector 40 to read data (flag value) from the flag cell FC of the memory core M1, which is coupled to the word line WL0. The determiner 30 then determines whether the read flag cell FC is "0" or "1". When the flag cell FC is "0", the memory core M1 is accessible. When the flag cell FC is "1", the memory core M1 is inaccessible. In this case, the flag cell FC of the memory core M1 is "0" (refer to FIG. 1). Thus, the determiner 30 determines that the memory core M1 is accessible. The write processing then advances to step S3.

In step S3, the determiner 30 determines whether data has been already written to the memory core M1, which is coupled to the word line WL0. That is, the determiner 30 determines whether the memory core M1 is blank. To enable this determination, for example, the determiner 30 includes an internal counter for counting the number of times data has been written (number of write times). The determiner 30 determines whether the memory core M1 is blank based on the count value of the counter. In this case, the number of write times is zero. Thus, the determiner 30 determines that the memory core M1 is blank. The write processing then advances to step S4.

In step S4, the determiner 30 issues a write command to the switch selector 40. In response to the write command, the switch selector 40 writes the 8-bit data 11011001 stored in the data register 60 to the eight data cells DC that are coupled to the word line WL0. The determiner 30 selects the memory core M1 as a write subject memory core (memory core subject to access control). As a result, the 8-bit data 11011001 is written to the data cells DC of the memory core M1 as shown in the state of FIG. 4A.

The data read operation for reading the 8-bit data that has been written to the memory core M1 will now be described.

In the data read operation, the command register 50 receives a read signal and generates a read command in response to the read signal.

Figures 3, 4A, 4B, 4C:
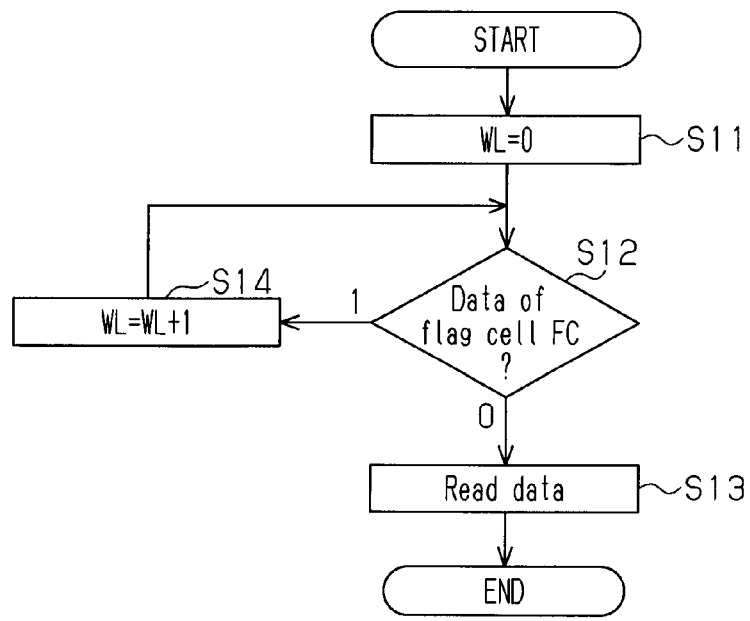
FIG. 3 is a flowchart illustrating a data read operation of the semiconductor memory device of FIG. 1.
FIG. 4A is a chart illustrating the setting of flag cells shown in FIG. 1.
FIG. 4B is a chart illustrating the setting of the flag cells shown in FIG. 1.
FIG. 4C is a chart illustrating the setting of the flag cells shown in FIG. 1.

Referring to FIG. 3, the determiner 30 provides the decoder 20 with a selection signal SS for selecting the word line WL0 in step S11 in response to the read command, which is generated by the command register 50. The determiner 30 also provides the switch selector 40 with the read command. The decoder 20 selects the word line WL0 in response to the selection signal SS, which is provided from the determiner 30.

In step S12, the determiner 30 controls the switch selector 40 to read data from the flag cell FC of the memory core M1, which is coupled to the word line WL0. The determiner 30 determines whether the read flag cell FC is "0" or "1". When the flag cell FC is "0", the memory core M1 is accessible (readable). When the flag cell FC is "1", the memory core M1 is inaccessible (unreadable). In this case, the flag cell FC of the memory core M1 is "0" (refer to FIG. 4A). Thus, the determiner 30 determines that the memory core M1 is readable. The read processing then advances to step S13.

In step S13, the determiner 30 issues a read command to the switch selector 40. In response to the read command, the switch selector 40 reads the data stored in the data cells DC of the memory core M1 and outputs the read data as the output data Dout. As a result, the 8-bit data 11011001, which has been written to the data cells DC of the memory core M1, is output from the semiconductor memory device 1. In this manner, the determiner 30 selects the memory core M1 as a read subject memory core (memory core subject to access control). In other words, the determiner 30 selects the memory core that is the same as the memory core selected in the data write operation. As a result, the 8-bit data is read from the data cells DC of the memory core M1.

The data write operation for writing the second 8-bit data 10001110 (second data) will now be described.

First, the 8-bit data 10001110 is stored in the data register 60 via the command register 50. In step S1 shown in FIG. 2, the determiner 30 provides the decoder 20 with a selection signal SS for selecting the word line WL0. The write processing then advances to step S2.

In step S2, the determiner 30 controls the switch selector 40 to read data from the flag cell FC of the memory core M1, which is coupled to the word line WL0. The determiner 30 then determines the flag value of the read flag cell FC. In this case, the determiner 30 determines that the flag cell FC of the memory core M1 is "0" (refer to FIG. 4A). The write processing then advances to step S3.

In step S3, the determiner 30 determines that the memory core M1 is not blank based on the number of write times (registered with the internal counter of the determiner 30). The write processing then advances to step S5.

In step S5, the determiner 30 controls the switch selector 40 to write "1" to the flag cell FC coupled to the word line WL0, that is, the flag cell FC of the memory core M1 (refer to FIG. 4B). The write processing then advances to step S6. As described above, in the first embodiment, the memory core including the flag cell FC to which "1" has been written is inaccessible.

In step S6, the determiner 30 increments the previously selected word line number to change the word line. Then, the determiner 30 provides the decoder 20 with a selection signal SS for selecting the resulting word line. In this case, the determiner 30 adds 1 to the word line number 0 and changes the word line to the word line WL1. Further, the determiner 30 provides the decoder 20 with a selection signal SS for selecting the word line WL1. The write processing then returns to step S2.

In step S2, the determiner 30 controls the switch selector 40 to read data from the flag cell FC of the memory core M2 that is coupled to the word line WL1. The determiner 30 then determines the flag value of the flag cell FC. In this case, the flag cell FC of the memory core M2 is "0" (refer to FIG. 4B). Thus, the determiner 30 determines that the memory core M2 is accessible. The write processing then advances to step S3.

In step S3, the determiner 30 determines that the data cells DC of the memory core M2 are blank based on the number of write times of the memory core M2. The write processing then advances to step S4. In step S4, the switch selector 40 writes the 8-bit data 10001110 stored in the data register 60 to the data cells DC that are coupled to the word line WL1 in response to a write command provided from the determiner 30. As a result, the 8-bit data 10001110 is written to the data cells DC of the memory core M2 as shown in the state of FIG. 4C.

As described above, the determiner 30 sets the memory core M1 to be inaccessible by writing "1" to the flag cell FC of the memory core M1 using the switch selector 40 when receiving the second input data Din. The determiner 30 further switches the selection signal SS, which is to be provided to the decoder 20, from a signal for selecting the word line WL0 to a signal for selecting the word line WL1. As a result, the write subject memory core is switched from the memory core M1 to the memory core M2. In this manner, the memory core M1 (predetermined memory core) is first set to be inaccessible and then the memory core M2 (next memory core) is selected. Thus, the semiconductor memory device 1 writes the 8-bit data 10001110 to the data cells DC of the memory core M2 that is selected as the write subject after virtually erasing data stored in the memory core M1. This enables the semiconductor memory device 1 to write new data after virtually erasing the data, or virtually rewrite data.

The data read operation for reading the second 8-bit data, that is, the 8-bit data that has been written to the memory core M2, will now be described.

In the same manner as in the first read operation described above, the determiner 30 provides the decoder 20 with a selection signal SS for selecting the word line WL0 in step S11 as shown in FIG. 3. The read processing then advances to step S12.

In step S12, the determiner 30 controls the switch selector 40 to read data from the flag cell FC of the memory core M1, which is coupled to the word line WL0. The determiner 30 then determines the flag value of the read flag cell FC. In this case, the determiner 30 determines that the read flag cell FC is "1" (refer to FIG. 4C). Thus, the determiner 30 determines that the memory core M1 is unreadable. The read processing then advances to step S14.

In step S14, the determiner 30 adds 1 to the previously selected word line number 0 to change the word line to the word line WL1. Then, the determiner 30 provides the decoder 20 with a selection signal SS for selecting the word line WL1. The read processing then returns to step S12.

In step S12, the determiner 30 controls the switch selector 40 to read data from the flag cell FC of the memory core M2, which is coupled to the word line WL1 that is selected by the decoder 20, and determines the flag value of the flag cell FC. In this case, the flag cell FC of the memory core M2 is "0" (refer to FIG. 4C). Thus, the determiner 30 determines that the memory core M2 is readable. The read processing then advances to step S13.

In step S13, the switch selector 40 reads the data stored in the data cells DC of the memory core M2, which is coupled to the word line WL1, in response to a read command that is provided from the determiner 30. The switch selector 40 then outputs the read data as the output data Dout. As a result, the 8-bit data 10001110, which has been written to the data cells DC of the memory core M2, is output from the semiconductor memory device 1. In the data read operation of the memory core M2, the first 8-bit data that has been written to the data cells DC of the memory core M1 cannot be read because the flag cell FC of the memory core M1 is "1" (inaccessible). In this case, the semiconductor memory device 1 virtually erases the data of the memory core M1. As a result, only the second 8-bit data that has been written to the memory core M2 can be read. The determiner 30 selects the word lines in the order of the word line WL0, the word line WL1, the word line WL2, and the word line WL3 during the data writing and read operations. This word line selection order is irreversible.

In the same manner, the semiconductor memory device 1 writes the third input data Din into the memory core M3 and the fourth input data Din into the memory core M4. In other words, the semiconductor memory device 1 of the first embodiment can rewrite data up to three times.

The semiconductor memory device 1 of the first embodiment has the advantage described below.

(1) The determiner 30 controls the switch selector 40 to write "1" to the flag cell FC of the memory core M1 when receiving the second input data Din. As a result, the memory core M1 is set to be inaccessible, and the data that has been written to the memory core M1 is set to be unreadable. The determiner 30 further increments the word line number in step S6, as shown in FIG. 2, and generates a switch signal SS for switching the word line that is selected by the decoder 20 from the word line WL0 to the word line WL1. As a result, the write subject memory core is switched from the memory core M1 to the memory core M2. Thus, the semiconductor memory device 1 virtually erases data of the memory core M1 while writing the second input data Din to the data cells DC of the memory core M2 that is newly set as the write subject. In other words, the semiconductor memory device 1 virtually rewrites its data. This enables the semiconductor memory device 1 to perform the same write operation as the write operation enabled by non-volatile memory cells that have no data writing limitations. Further, the semiconductor memory device 1 does not require circuits for erasing data. As a result, there is no need for a negative voltage application circuit that occupies a large circuit area. This reduces the circuit size of the semiconductor memory device 1.

A semiconductor memory device according to a second embodiment will now be discussed with reference to FIGS. 5 to 7. The semiconductor memory device according to the second embodiment differs from the semiconductor memory device 1 of the first embodiment in the functions of the determiner 30 and flag cells FC. The second embodiment will be described focusing on the differences from the first embodiment.

The semiconductor memory device of the second embodiment has substantially the same structure as the semiconductor memory device 1 of the first embodiment shown in FIG. 1. The operation of the semiconductor memory device of the second embodiment will now be described with reference to FIGS. 5 to 7.

The data write operation for writing the first 8-bit data 11011001 to the memory unit 11 that is in an initial state as shown in FIG. 1 will first be described.

Figure 5:
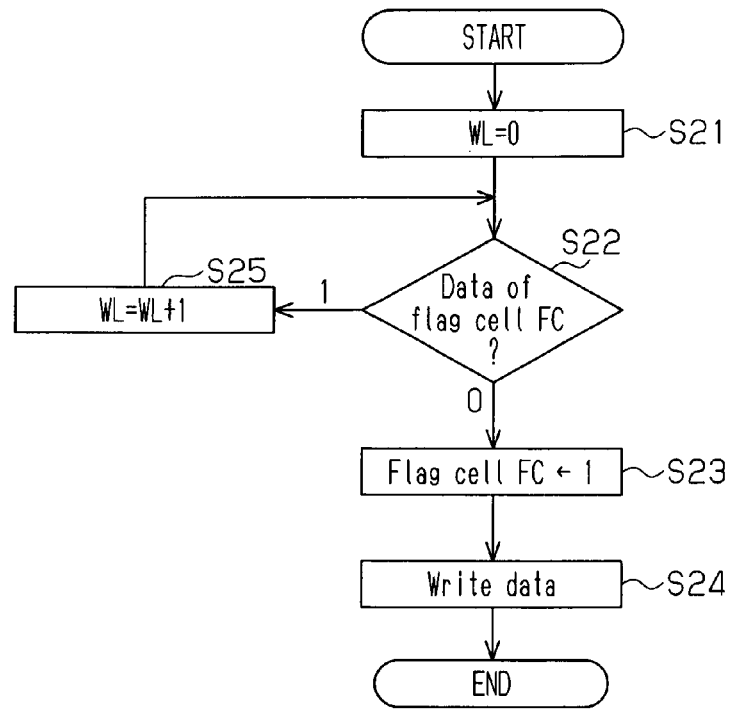
FIG. 5 is a flowchart illustrating a data write operation according to a second embodiment.

In step S21 shown in FIG. 5, the determiner 30 performs the same processing as the processing in step S1 shown in FIG. 2. The write processing then advances to step S22.

In step S22, the determiner 30 controls the switch selector 40 to read data from the flag cell FC of the memory core M1, which is coupled to the word line WL0. The determiner 30 then determines whether the read flag cell FC is "0" or "1". When the flag cell FC is "0", the memory core M1 is writable. When the read flag cell FC is "1", the memory core M1 is unwritable. In this case, the flag cell FC of the memory core M1 is "0" (refer to FIG. 1). Thus, the determiner 30 determines that the memory core M1 is writable. The write processing then advances to step S23.

In step S23, the determiner 30 controls the switch selector 40 to write "1" to the flag cell FC that is coupled to the word line WL0, or the flag cell FC of the memory core M1 (refer to FIG. 7A). In the second embodiment, when "1" is written to the flag cell FC, the memory core including the flag cell FC is set to be readable and unwritable. When "0" is written to the flag cell FC, the memory core including the flag cell FC is set to be unreadable and writable. In this case, as described above, the determiner 30 writes the bit value 1 to the flag cell FC of the memory core M1 that has been selected as the write subject. Thus, the memory core M1 is set to be readable and unwritable. The write processing then advances to step S24.

In step S24, the determiner 30 issues a write command to the switch selector 40. In response to the write command, the switch selector 40 writes the 8-bit data 11011001 stored in the data register 60 to the data cells DC of the memory core M1, which is coupled to the word line WL0.

The data read operation for reading the 8-bit data 11011001 that has been written to the memory core M1 will now be described.

In the data read operation, the command register 50 is provided with a read signal, and generates a read command in response to the read signal. In step S31 shown in FIG. 6, the determiner 30 provides the decoder 20 with a selection signal SS for selecting the word line WL0. The read processing then advances to step S32.

In step S32, the determiner 30 controls the switch selector 40 to read data from the flag cell FC of the memory core M1, which is coupled to the word line WL0. The determiner 30 then determines whether the read flag cell FC is "0" or "1". When the flag cell FC is "0", no data has been written to the data cells DC of the memory core M1. In other words, the memory core M1 is unreadable. When the flag cell FC is "1", the memory core M1 is readable. In this case, the flag cell FC of the memory core M1 is "1" (refer to FIG. 7B). Thus, the determiner 30 determines that the memory core M1 is readable. The read processing then advances to step S33.

In step S33, the determiner 30 issues a read command to the switch selector 40. In response to the read command, the switch selector 40 reads the data stored in the data cells DC of the memory core M1, which is coupled to the word line WL0, and outputs the read data as output data Dout. As a result, the 8-bit data 11011001, which has been written to the data cells DC of the memory core M1, is output from the semiconductor memory device. In other words, the determiner 30 reads data from the memory core M1 including the flag cell FC to which "1" has been written through the data write operation. The read processing then advances to step S34.

In step S34, the determiner 30 adds 1 to the previously selected word line number 0 to change the word line to the word line WL1. Then, the determiner 30 provides the decoder 20 with a selection signal SS for selecting the word line WL1. The read processing then returns to step S32.

In step S32, the determiner 30 controls the switch selector 40 to read data from the flag cell FC that is coupled to the word line WL1, and determines the flag value of the flag cell FC. In this case, the flag cell FC of the memory core M2 is "0" (refer to FIG. 7B). Thus, the determiner 30 determines that the memory core M2 is unreadable and ends the data read operation.

An operation for changing the bit width of the output data Dout from eight bits to sixteen bits will now be described. In this case, the first 8-bit data 11011001 corresponding to the eight high-order bits of 16-bit data is written first, and the 8-bit data 10001110 corresponding to the eight low-order bits of the 16-bit data is then written.

After the first data has been written, the 8-bit data 10001110 is stored in the data register 60 via the command register 50. As shown in FIG. 5, the determiner 30 first provides the decoder 20 with a selection signal SS for selecting the word line WL0 in step S21. The write processing then advances to step S22.

In step S22, the determiner 30 controls the switch selector 40 to read data from the flag cell FC of the memory core M1, which is coupled to the word line WL0, and determines the flag value of the flag cell FC. In this case, the flag cell FC of the memory core M1 is "1" (refer to FIG. 7B). Thus, the determiner 30 determines that the memory core M1 is unwritable. The write processing then advances to step S25.

In step S25, the determiner 30 adds 1 to the previously selected word line number 0 to change the word line to the word line 1. Further, the determiner 30 provides the decoder 20 with a selection signal SS for selecting the word line WL1. The write processing then returns to step S22.

In step S22, the determiner 30 controls the switch selector 40 to read data from the flag cell FC of the memory core M2, which is coupled to the word line WL1, and determines the flag value of the flag cell FC. In this case, the flag cell FC of the memory core M2 is "0" (refer to FIG. 7B). Thus, the determiner 30 determines that the memory core M2 is writable. The write processing then advances to step S23.

In step S23, the determiner 30 writes the bit value 1 to the flag cell FC of the memory core M2 that is selected as the write subject. In step S24, the determiner 30 writes the low-order 8-bit data 10001110 to the data cells DC of the memory core M2 (refer to FIG. 7C). The memory core M2 is set to be readable and unwritable in step S23 as described above. More specifically, the memory cores M1 and M2 are both set to be readable as shown in FIG. 7C. In this case, data is readable from the data cells DC of both of the memory cores M1 and M2. In other words, the 16-bit data 11011001/10001110 is handled as having been written to the data cells FC of the memory cores M1 and M2.

The data read operation for reading the 16-bit data that has been written to the data cells DC of the memory cores M1 and M2 will now be described.

Figure 6:
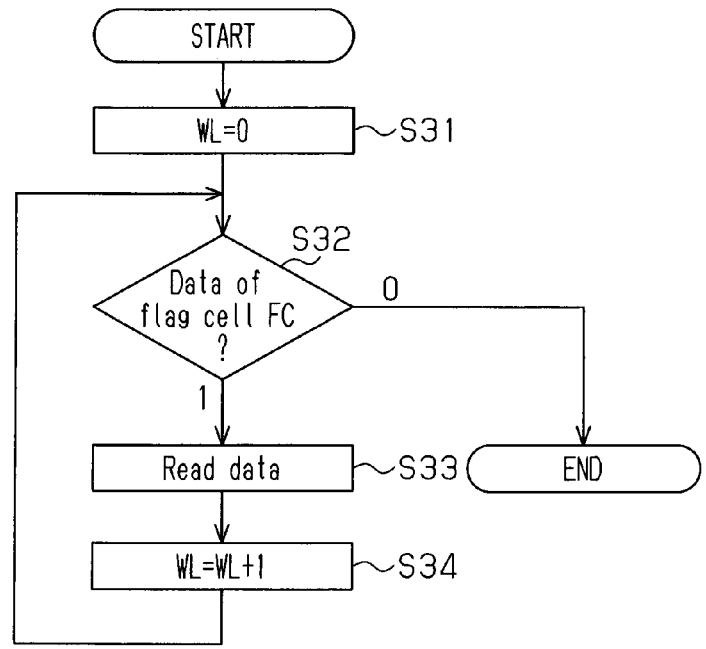
FIG. 6 is a flowchart illustrating a data read operation in the second embodiment.

In step S31 shown in FIG. 6, the determiner 30 provides the decoder 20 with a selection signal SS for selecting the word line WL0 in the same manner as in the first data read operation described above. The read processing then advances to step S32.

In step S32, the determiner 30 controls the switch selector 40 to read data from the flag cell FC of the memory core M1, which is coupled to the word line WL0. The determiner 30 then determines the flag value of the read flag cell FC. In this case, the flag cell FC is "1" (refer to FIG. 7C). Thus, the determiner 30 determines that the memory core M1 is readable. The read processing then advances to step S33.

In step S33, the switch selector 40 reads the data stored in the data cells DC of the memory core M1, which is coupled to the word line WL0, in response to a read command provided from the determiner 30 and outputs the read data as the output data Dout. As a result, the high-order 8-bit data 11011001, which has been written to the data cells DC of the memory core M1, is output from the semiconductor memory device. The read processing then advances to step S34.

In step S34, the determiner 30 adds 1 to the previously selected word line number 0 to change the word line to the word line 1. Further, the determiner 30 provides the decoder 20 with a selection signal SS for selecting the word line WL1. The read processing then returns to step S32.

In step S32, the determiner 30 controls the switch selector 40 to read data from the flag cell FC of the memory core M2, which is coupled to the word line WL1, and determines the flag value of the flag cell FC. In this case, the flag cell FC of the memory core M2 is "1" (refer to FIG. 7C). Thus, the determiner 30 determines that the memory core M2 is readable. The read processing then advances to step S33.

In step S33, the switch selector 40 reads the data stored in the data cells DC of the memory core M2, which is coupled to the word line WL1, in response to a read command provided from the determiner 30. The switch selector 40 then outputs the read data as the output data Dout. As a result, the low-order 8-bit data 10001110, which has been written to the data cells DC of the memory core M2, is output from the semiconductor memory device. The read processing then advances to step S34.

In step S34, the determiner 30 changes the word line to the word line WL2 by adding 1 to the previously selected word line number 1. Further, the determiner 30 provides the decoder 20 with a selection signal SS for selecting the word line WL2. The read processing then advances to step S32.

In step S32, the determiner 30 controls the switch selector 40 to read data from the flag cell FC of the memory core M3, which is coupled to the word line WL2, and determines the flag value of the flag cell FC. In this case, the flag cell FC of the memory core M3 is 0 (refer to FIG. 7C). Thus, the determiner 30 determines that the memory core M2 is unreadable and ends the data read operation.

As described above in the second embodiment, data is read from both of the memory cores M1 and M2, which have been set to be readable based on the flag cells FC. More specifically, the semiconductor memory device can read the 16-bit data that has been written to the memory cores M1 and M2. In other words, the semiconductor memory device changes its readable data from 8-bit data to the 16-bit data. The determiner 30 selects the word lines in the order of the word line WL0, the word line WL1, the word line WL2, and the word line WL3 during the data writing and read operations. This word line selection order is irreversible.

In the same manner, the semiconductor memory device of the second embodiment can change the bit width of the output data Dout to 24 bits and to 32 bits by writing 8-bit data to the memory cores M3 and M4. The semiconductor memory device of the second embodiment includes 32 data cells DC. Thus, the semiconductor memory device of the second embodiment can write and read data having bit widths up to 32 bits.

The semiconductor memory device of the second embodiment has the advantage described below in addition to advantage (1) of the first embodiment.

(2) In the data write operation, the determiner 30 writes the input data Din to the data cells DC while writing "1" to the flag cell FC. The memory core including the flag cell FC to which "1" has been written is set to be readable. This enables the determiner 30 to read the data written to all of the data cells DC in the memory unit 11. The determiner 30 can change the bit width of the output data Dout by writing data to the data cells DC of each of the memory cores M1 to M4 so as to virtually rewrite data. In the present example, the semiconductor memory device changes the bit width of the output data Dout from the 8-bit data 11011001 to the 16-bit data 11011001/10001110. The semiconductor memory device can change the bit width of the output data Dout in this manner without the need to include circuits for erasing data, which occupy a large circuit area. This reduces the circuit size of the semiconductor memory device.

Further, the bit width of the written and read data is variable. Thus, the bit width of a setting value for setting the internal status of a semiconductor integrated circuit can be changed, for example, by simply writing "1" to the flag cell FC. The bit width of the setting value can be varied without changing, for example, a reticle used for the semiconductor integrated circuit. This enables quick and flexible LSI design changes and lowers costs.

A semiconductor memory device 3 according to a third embodiment will now be described with reference to FIGS. 8 to 10. The semiconductor memory device 3 of the third embodiment differs from the semiconductor memory device 1 of the first embodiment in the structures of a memory unit 13 and data register 60 and the function of a determiner 30. The third embodiment will be described focusing on the differences from the first embodiment.

Figure 8:
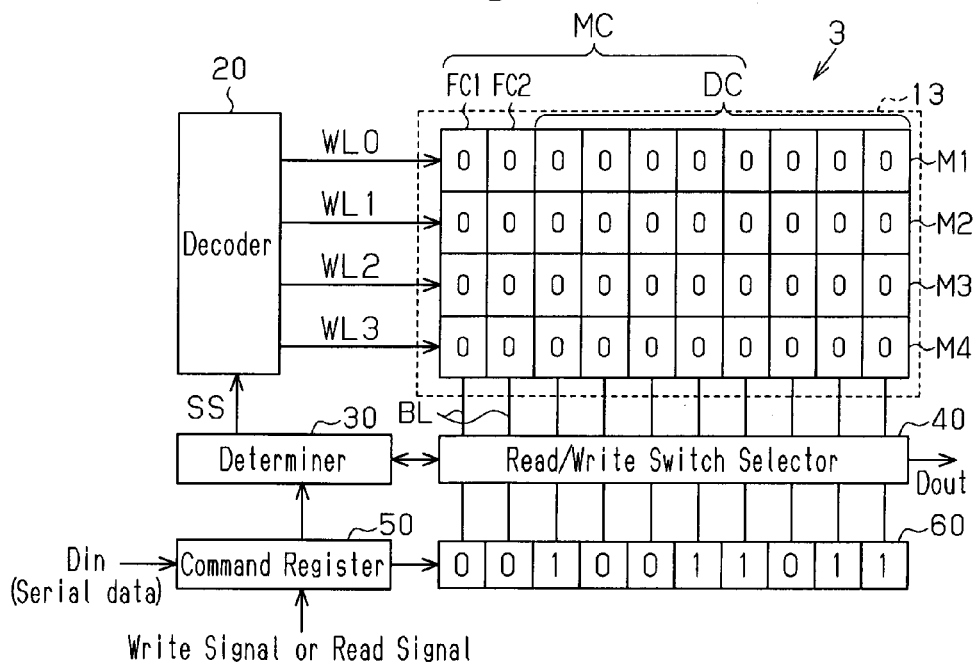
FIG. 8 is a schematic block diagram of a semiconductor memory device according to a third embodiment.

As shown in FIG. 8, the memory unit 13 includes a plurality of (four in FIG. 8) memory cores M1 to M4, which are arranged in the column direction. Each of the memory cores M1 to M4 includes a first flag cell FC1, a second flag cell FC2, and eight data cells DC. A flag value for switching word lines (write control or read control value) is written to the first flag cell FC1. A flag value indicating the bit width of data is written to the second flag cell FC2. Data writing and read operations for writing or reading data to and from the data cells DC of a specific memory core are performed based on the data of the first and second flag cells FC1 and FC2. The value "0" (flag value) for a first flag cell FC1 indicates that the memory core including the first flag cell FC1 is accessible. The value "1" for a first flag cell FC1 indicates that the memory core including the first flag cell FC1 is inaccessible. The value "0" (flag value) for a second flag cell FC2 indicates that the memory core including the second flag cell FC2 is at a reading end position or a writing end position. The value "1" for a second flag cell FC2 indicates that the memory core including the second flag cell FC2 is at a reading continued position or a writing continued position.

The command register 50 receives 10-bit data as input data Din. The command register 50 first receives a write signal and then receives the input data Din. Then, the command register 50 outputs the input data Din to the data register 60 in the order in which the data has been input. For example, when receiving the 10-bit data of 1101100100 as the input data Din, the data register 60 stores the data in a manner that the highest-order bit of the data is stored in the leftmost register of the data register 60 as shown in FIG. 8. The data register 60 includes a plurality of (10 in FIG. 8) registers corresponding to the data cells DC, the first flag cell FC1, and the second flag cell FC2 that form each memory core. Thus, the two low-order bits of the 10-bit data are written to the first and second flag cells FC1 and FC2, and the eight high-order bits of the 10-bit data are written to the data cells DC.

The operation of the semiconductor memory device 3 with the above-described structure will now be described with reference to FIGS. 9 and 10.

First, the data write operation for writing the first 8-bit data 11011001 to the memory unit 13 that is in an initial state as shown in FIG. 8 (state in which all the memory cells MC are blank) will be described.

In the data write operation, the command register 50 is provided with a write signal and generates a write command in response to the write signal. Next, the command register 50 is provided with the 10-bit data 1101100100, which includes the 8-bit data 11011001. The command register 50 outputs the 10-bit data to the data register 60 in the order in which the data has been input. The data register 60 stores the 10-bit data as shown in FIG. 8. In this case, the value "0" stored in the register corresponding to the first flag cell FC1 indicates that the eight high-order bits of the 10-bit data are to be written to the data cells DC of the memory core M1. The value "0" stored in the register corresponding to the second flag cell FC2 indicates that the data written to the memory unit 13 is 8-bit data.

Subsequently, the determiner 30 receives a write command from the command register 50 and provides the decoder 20 with a selection signal SS for selecting the word line WL0 in response to the write command. The determiner 30 also provides the switch selector 40 with the write command. The decoder 20 selects the word line WL0 in response to the selection signal SS, which is provided from the determiner

30. The switch selector 40 operates as a write circuit in response to the write command.

When operating as the write circuit, the switch selector 40 writes the lowest-order bit of the 10-bit data stored in the data register 60 to the first flag cell FC1 of the memory core M1, which is coupled to the word line WL0.

Subsequently, the determiner 30 reads data (written data) from the first flag cell FC1 of the memory core M1, which is coupled to the word line WL0. In this case, the read flag cell FC is "0" (refer to FIG. 10A). Thus, the determiner 30 determines that the memory core M1 is accessible and issues a write command to the switch selector 40. In response to the write command, the switch selector 40 writes the high-order 9-bit data 110110010 included in the 10-bit data stored in the data register 60 to the data cells DC and the second flag cell FC2, which are coupled to the word line WL0.

Then, the determiner 30 controls the switch selector 40 to read data from the second flag cell FC2 of the memory core M1, which is coupled to the word line WL0. The determiner 30 determines whether the read data is "0" or "1". When the second flag FC2 is "0", the determiner 30 determines that the memory core M1 is at the position at which data writing has been completed (writing end position). When the second flag FC2 is "1", the determiner 30 determines that data writing is to be continued. In this case, the second flag cell FC2 of the memory core M1 is "0" (refer to FIG. 10A). Thus, the determiner 30 determines that the data written to the memory unit 13 is 8-bit data. In other words, the determiner 30 determines that the memory core M1 is at the writing end position and ends the data write operation.

In this manner, the memory core M1 is selected as the write subject based on the selection signal SS, which is generated by the determiner 30, and the data written to the first flag cell FC1. The 8-bit data 11011001 is written to the data cells DC of the memory core M1. Further, the data of the second flag cell FC2 determines the writing end position.

The data read operation for reading the 8-bit data 11011001 (refer to FIG. 10A), which has been written to the memory core M1, will now be described.

In the data read operation, the command register 50 is provided with a read signal and generates a read command in response to the read signal.

Figure 9:
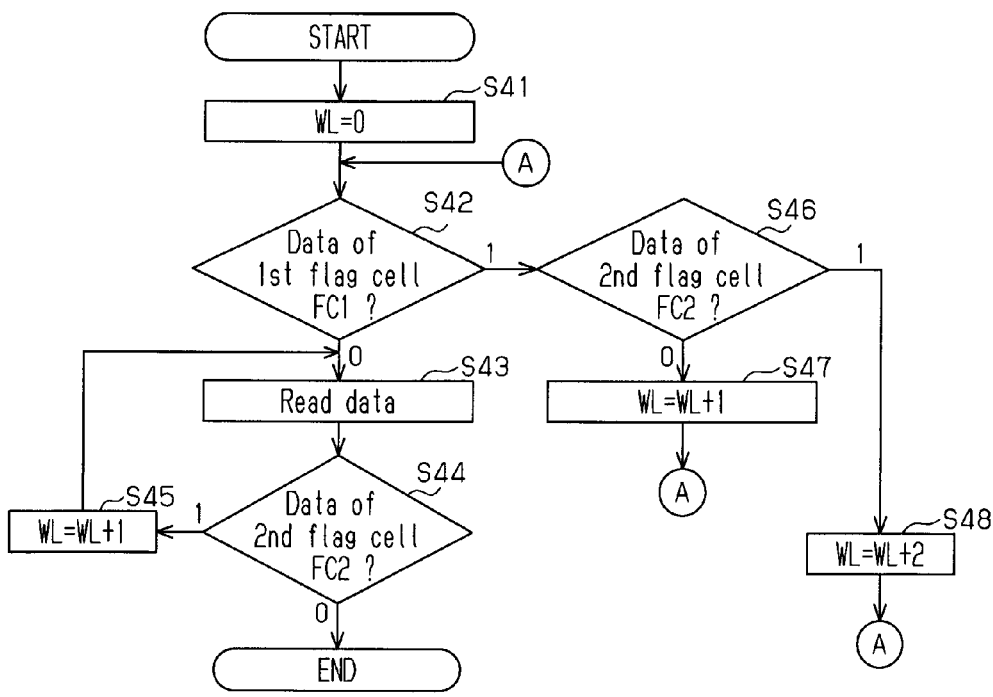
FIG. 9 is a flowchart illustrating a data read operation of the semiconductor memory device shown in FIG. 8.

In step S41 shown in FIG. 9, the determiner 30 provides the decoder 20 with a selection signal SS for selecting the word line WL0 in response to the read command, which is generated by the command register 50. The determiner 30 also provides the switch selector 40 with the read command. The decoder 20 selects the word line WL0 in response to the selection signal SS, which is provided from the determiner 30.

In step S42, the determiner 30 controls the switch selector 40 to read data from the first flag cell FC1 of the memory core M1, which is coupled to the word line WL0. The determiner 30 determines whether the first flag cell FC1 is "0" or "1". When the first flag cell FC1 is "0", the memory core M1 is accessible (readable). When the first flag cell FC1 is "1", the memory core M1 is inaccessible (unreadable). In this case, the first flag cell FC1 of the memory core M1 is "0" (refer to FIG. 10A). Thus, the determiner 30 determines that the memory core M1 is accessible (readable). The read processing then advances to step S43.

In step S43, the determiner 30 issues a read command to the switch selector 40. The switch selector 40 reads the data stored in the data cells DC of the memory core M1, which is coupled to the word line WL0, and outputs the read data as the output data Dout. As a result, the 8-bit data 11011001, which has been written to the data cells DC of the memory core M1, is output from the semiconductor memory device 3. The read processing then advances to step S44.

In step S44, the determiner 30 controls the switch selector 40 to read data from the second flag cell FC2 of the memory core M1, which is coupled to the word line WL0. The determiner 30 determines whether the second flag cell FC2 is "0" or "1". When the second flag FC2 is "0", the determiner 30 determines that the memory core M1 is located at a position at which data reading has been completed (reading end position). When the second flag FC2 is "1", the determiner 30 determines that following input data Din (e.g., eight low-order bits of the 16-bit data) continues in the memory core (the memory core M2) that is coupled to the next word line (the word line WL1). In this case, the second flag cell FC2 of the memory core M1 is "0" (refer to FIG. 10A). Thus, the determiner 30 determines that the memory core M1 is at the data reading position and ends the data read operation.

In this manner, the memory core M1 to which the 8-bit data has been written is selected as a read subject memory core based on the selection signal SS, which is generated by the determiner 30, and the data of the first flag cell FC1, which has the value of "0". The data is then read from the memory core M1. Further, the data of the second flag cell FC2 determines the reading end position.

The data write operation for further writing 16-bit data 10001110/11010111 to the memory unit 13, in which the above 8-bit data has been written to the data cells DC of the memory core M1, will now be described.

In the same manner as in the first write operation described above, the command register 50 generates a write command in response to a write signal. As shown in FIG. 10B, 10-bit data 1000111011, which includes the high-order 8-bit data 10001110, is stored in the data register 60 via the command register 50. In this state, the value "1" stored in the register corresponding to the first flag cell FC1 indicates that the write subject memory core needs to be changed. Also, the value "1" stored in the register corresponding to the second flag cell FC2 indicates that the written data is greater than 8-bit data. More specifically, the bit value 1 for the second flag cell FC2 indicates that the written data is 16-bit data in the third embodiment.

In response to the write command provided from the command register 50, the determiner 30 provides the decoder 20 with a selection signal SS for selecting the word line WL0. The determiner 30 also provides the switch selector 40 with the write command. The decoder 20 selects the word line WL0 in response to the selection signal SS, which is provided from the determiner 30. The switch selector 40 operates as a write circuit in response to the write command.

When operating as the write circuit, the switch selector 40 writes the lowest-order bit (bit value 1) of 10-bit data, which is stored in the data register 60 to the first flag cell FC1 of the memory core M1, which is coupled to the word line WL0. More specifically, the switch selector 40 sets the memory core M1 to be inaccessible by writing the "1" to the first flag cell FC1 of the memory core M1, to which the first data has been written. As a result, the data written to the memory core M1 is virtually erased.

The determiner 30 controls the switch selector 40 to read data (written data) from the first flag cell FC1 of the memory core M1, which is coupled to the word line WL0. The determiner 30 then determines the flag value of the first flag cell FC1. In this case, the flag cell FC of the memory core M1 is "1" (refer to FIG. 10B). Thus, the determiner 30 determines that the memory core M1 is inaccessible (unwritable). The determiner 30 then adds 1 to the previously selected word line number 0 to change the word line to the word line WL1 and provides the decoder 20 with a selection signal SS for selecting the word line WL1.

In response to a read command provided from the determiner 30, the switch selector 40 writes the high-order 9-bit data 100011101 of the 10-bit data stored in the data register 60 to the data cells DC and the second flag cell FC2 of the memory core M2, which is coupled to the word line WL1. The memory core M2, which is next to the memory core M1, is selected as the write subject based on the selection signal SS, which is generated by the determiner 30, and the data written to the first flag cell FC1. As a result, the high-order 8-bit data 10001110 of the 16-bit data is written to the data cells DC of the memory core M2.

Subsequently, the determiner 30 controls the switch selector 40 to read data from the second flag cell FC2 of the memory core M2, which is coupled to the word line WL1. The determiner 30 then determines the flag value of the second flag cell FC2. In this case, the second flag cell FC2 of the memory core M2 is "1" (refer to FIG. 10B). Thus, the determiner 30 determines that the data written to the memory unit 13 is greater than 8-bit data, or that data writing is continued. The determiner 30 changes the word line to the word line WL2 by adding 1 to the previously selected word line number 1. The determiner 30 then provides the decoder 20 with a selection signal SS for selecting the word line WL2.

As shown in FIG. 10C, 10-bit data 1101011100 including the low-order 8-bit data 11010111 of the 16-bit data is stored in the data register 60 as shown in FIG. 10C.

In response to a write command provided from the determiner 30, the switch selector 40 writes the high-order 9-bit data 110101110 of the 10-bit data stored in the data register 60 to the data cells DC and the second flag cell FC2 of the memory core M3, which is coupled to the word line WL2.

The determiner 30 controls the switch selector 40 to read data from the second flag cell FC2 of the memory core M2, which is coupled to the word line WL2, and determines the flag value of the second flag cell FC2. In this case, the second flag cell FC2 of the memory core M3 is "0" (refer to FIG. 10C). Thus, the determiner 30 determines that the memory core M3 is at the writing end position and ends the data write operation.

As described above, when receiving the second input data Din, the determiner 30 sets the memory core M1 to be inaccessible by writing "1" to the flag cell FC of the memory core M1 using the switch selector 40. Further, the determiner 30 switches the selection signal SS, which is provided to the decoder 20, from the signal for selecting the word line WL0 to the signal for selecting the word line WL1. As a result, the write subject memory core is switched from the memory core M1 to the memory core M2. In this manner, the memory core M2 is selected after the memory core M1 becomes inaccessible. Thus, the semiconductor memory device 3 writes the high-order 8-bit data 11011001 of the 16-bit data to the data cells DC of the memory core M2 that is selected as the write subject after virtually erasing the data of the memory core M1. This enables the semiconductor memory device 3 to write new data after virtually erasing data. In other words, the semiconductor memory device 3 can virtually rewrite its data. Further, the semiconductor memory device 3 can write the low-order 8-bit data 11010111 of the 16-bit data to the memory core M3, which is next to the memory core M2, based on the bit value 1 of the second flag cell FC2 of the memory core M2.

The data read operation for reading the 16-bit data 10001110/11010111 (refer to FIG. 10C), which has been written to the memory cores M2 and M3, will now be described.

In the same manner as in the data read operation described above, the determiner 30 provides the decoder 20 with a selection signal SS for selecting the word line WL0 in step S41 shown in FIG. 9. The read processing then advances to step S42.

In step S42, the determiner 30 controls the switch selector 40 to read data from the first flag cell FC1 of the memory core M1, which is coupled to the word line WL0. The determiner 30 determines the flag value of the first flag cell FC1. In this case, the first flag cell FC1 of the memory core M1 is "1" (refer to FIG. 10C). Thus, the determiner 30 determines that the memory core M1 is unreadable. The read processing then advances to step S46.

In step S46, the determiner 30 controls the switch selector 40 to read data from the second flag cell FC2 of the memory core M1, which is coupled to the word line WL0. The determiner 30 determines whether the second flag cell FC2 is "0" or "1". When the second flag cell FC2 is "0", the data written to the memory unit 13 is 8-bit data. When the second flag cell FC2 is "1", the data written to the memory unit 13 is greater than 8-bits. In this case, the second flag cell FC2 of the memory core M1 is "0" (refer to FIG. 10C). Thus, the determiner 30 determines that the data written to the memory unit 13 (specifically the memory core M1 in this case) is 8-bit data. The read processing then advances to step S47.

In step S47, the determiner 30 adds 1 to the previously selected word line number 0 to change the word line to the word line 1, and provides the decoder 20 with a selection signal SS for selecting the word line WL1. The read processing then returns to step S42.

In step S46, when the second flag cell FC2 is "1", that is, when the data written to the memory unit 13 is 16-bit data, the read processing advances to step S48. In step S48, the determiner 30 adds 2 to the previously selected word line number 0 to change the word line to the word line WL2 and provides the decoder 20 with a selection signal SS for selecting the word line WL2. The read processing then returns to step S42. More specifically, when the second flag cell FC2 of the memory core M1 is "1", data has been written to the data cells DC of the memory core M2, and the memory core M2 is unreadable in the same manner as the memory core M1. Thus, the word line is changed from the word line WL0 to the word line WL2 in step S48 by skipping the word line WL1.

In step S42, the determiner 30 controls the switch selector 40 to read data from the first flag cell FC1 of the memory core M2, which is coupled to the word line WL1. The determiner 30 determines the flag value of the first flag cell FC1. In this case, the first flag cell FC1 of the memory core M2 is "0" (refer to FIG. 10C). Thus, the determiner 30 determines that the memory core M2 is readable. The read processing then advances to step S43.

In step S43, the switch selector 40 reads the data stored in the data cells DC of the memory core M2, which is coupled to the word line WL1, in response to a read command provided from the determiner 30 and outputs the read data as the output data Dout. As a result, the high-order 8-bit data 10001110, which has been written to the data cells DC of the memory core M2, is output from the semiconductor memory device 3. The read processing then advances to step S44.

In step S44, the determiner 30 controls the switch selector 40 to read data from the second flag cell FC2 of the memory core M2, which is coupled to the word line WL2. The determiner 30 determines the flag value of the second flag cell FC2.

In this case, the second flag cell FC2 of the memory core M2 is "1" (refer to FIG. 10C). Thus, the determiner 30 determines that the data written to the memory unit 13 (specifically the memory core M2 in this case) is greater than 8-bit data, or that data reading is to be continued. The read processing then advances to step S45.

In step S45, the determiner 30 adds 1 to the previously selected word line number 1 to change the word line to the word line WL2 and provides the decoder 20 with a selection signal SS for selecting the word line WL2. The read processing then returns to step S43.

In step S43, the switch selector 40 reads the data stored in the data cells DC of the memory core M2, which is coupled to the word line WL2, in response to a read command provided from the determiner 30, and outputs the read data as the output data Dout. As a result, the low-order 8-bit data 11010111 written to the data cells DC of the memory core M3 is output from the semiconductor memory device 3. As a result, the 16-bit data written to the memory cores M2 and M3 is read. The read processing then advances to step S44.

In step S44, the determiner 30 controls the switch selector 40 to read data from the second flag cell FC2 of the memory core M3, which is coupled to the word line WL1. The determiner 30 determines the flag value of the second flag cell FC2. In this case, the second flag cell FC2 of the memory core M3 is "0" (refer to FIG. 10C). Thus, the determiner 30 determines that the memory core M3 is at the reading end position and ends the data read operation.

As described above in the third embodiment, data is read only from the data cells DC of the memory cores M2 and M3, to which the 16-bit data has been written. In other words, the first 8-bit data, which has been written to the memory core M1, is unreadable because the first flag cell FC1 is "1" (unreadable). Thus, the semiconductor memory device 3 reads only the 16-bit data written to the memory cores M2 and M3 after virtually erasing the memory core M1. Further, the determiner 30 selects the word lines in the order of the word line WL0, the word line WL1, the word line WL2, and the word line WL3 during the data writing and read operations. This word line selection order is irreversible.

The semiconductor memory device 3 of the third embodiment has the advantage described below in addition to advantage (1) of the first embodiment.

(3) Each of the memory cores M1 to M4 of the memory unit 13 has the second flag cell FC2 storing the flag value for determining the bit width of the data that is written or read. The determiner 30 determines the bit width of the data written to the memory unit 13 based on the flag value of the second flag cell FC2 and performs the data write operation or read operation. This enables the semiconductor memory device 3 to handle data with different bit widths, such as 8-bit data and 16-bit data.

A semiconductor memory device 4 according to a fourth embodiment will now be described with reference to FIGS. 11 to 14. The semiconductor memory device 4 of the fourth embodiment differs from the semiconductor memory device 1 of the first embodiment in the structure of a memory unit 14 and the function of a determiner 30. The fourth embodiment will be described focusing on the differences from the first embodiment.

Figure 11:
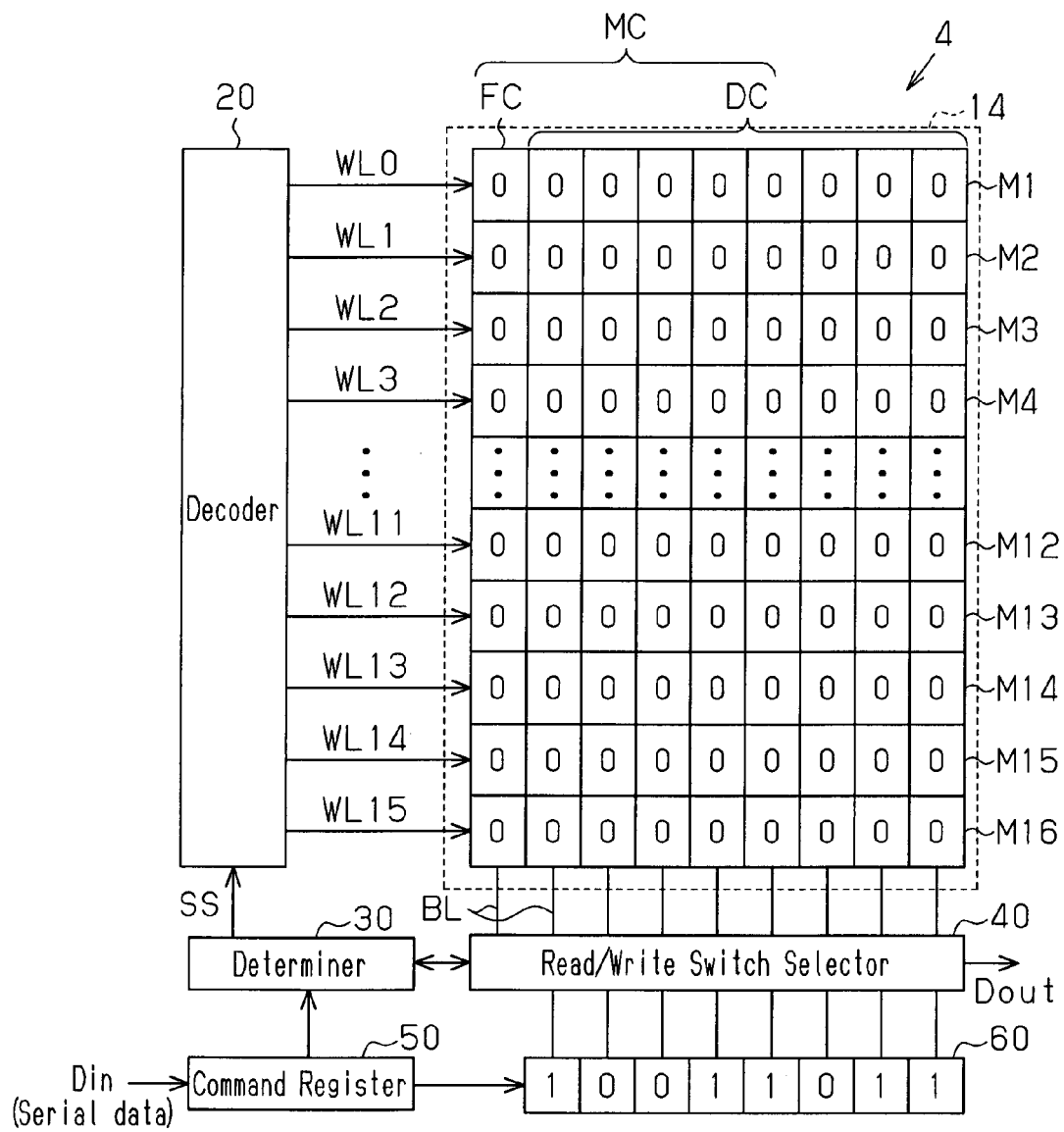
FIG. 11 is a schematic block diagram of a semiconductor memory device according to a fourth embodiment.

As shown in FIG. 11, the memory unit 14 includes a plurality of (16 in the fourth embodiment) memory cores M1 to M16, which are arranged in a column direction. Each of the memory cores M1 to M16 includes a flag cell FC and eight data cells DC. The flag cell FC indicates a data reading start position and a data reading end position. To write data having a data width greater than eight bits to the memory unit 14 in the fourth embodiment, the eight low-order bits of the data are first input into the data register 60. For example, when 16-bit data of 11011001/10001110 is written to the memory unit 14, the low-order 8-bit data 10001110 is first input into the data register 60.

The operation of the semiconductor memory device 4 with the above-described structure will now be described with reference to FIGS. 12 and 14.

First, the data write operation for writing the first 8-bit data 11011001 to the memory unit 14 that is in an initial state as shown in FIG. 11 (all the memory cells MC are blank) will be described.

In the data write operation, the command register 50 provides the determiner 30 with a write command in response to a write signal. Next, the command register 50 is provided with the 8-bit data 11011001, which is input data Din. The command register 50 outputs the 8-bit data to the data register 60 in the order in which the data is input (refer to FIG. 11).

Figure 12:
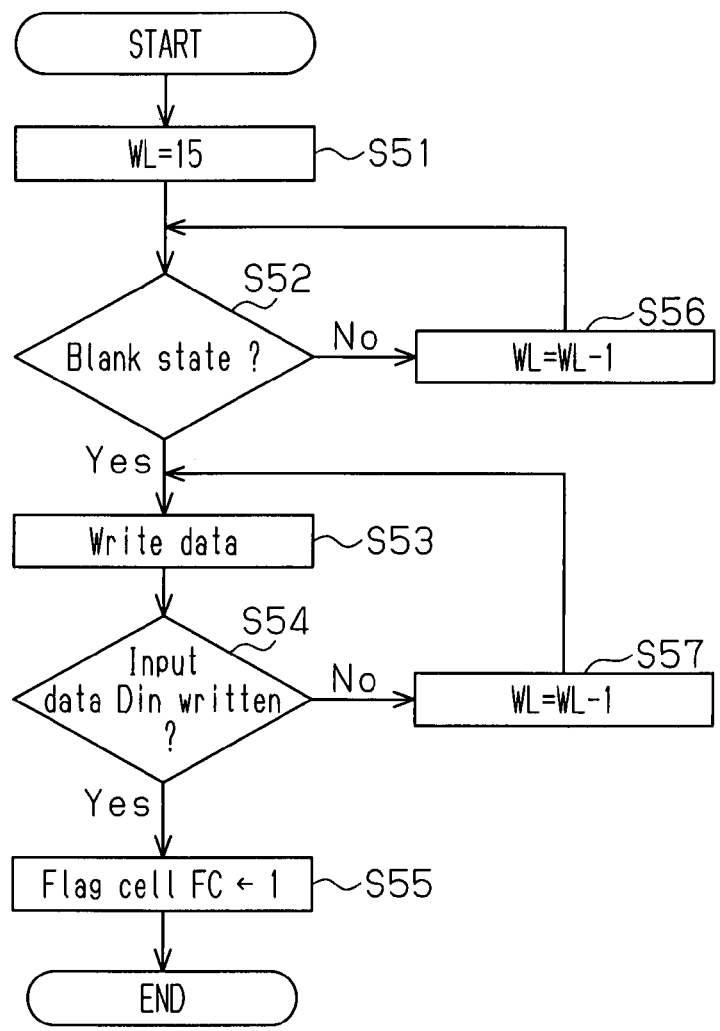
FIG. 12 is a flowchart illustrating a data write operation of the semiconductor memory device of FIG. 11.

In step S51 shown in FIG. 12, the determiner 30 provides the decoder 20 with a selection signal SS for selecting the word line WL15, which is the lowest line of the word lines shown in FIG. 11, in response to the write command, which is provided from the command register 50. The determiner 30 also provides the switch selector 40 with the write command. The decoder 20 selects the word line WL15 in response to the switch signal SS, which is provided from the determiner 30. The switch selector 40 operates as a write circuit in response to the write command.

In step S52, the determiner 30 determines whether data has been already written to the memory core M16, which is coupled to the word line WL15. More specifically, the determiner 30 determines whether the memory core M16 is blank. This determination is performed using for example a counter that counts the number of write times. The counter is arranged, for example, in the determiner 30. The determiner 30 determines whether the memory core M16 is blank based on the count value of the counter. In this case, the number of write times is zero. Thus, the determiner 30 determines that the memory core M16 is blank. The write processing then advances to step S53.

In step S53, the determiner 30 issues a write command to the switch selector 40. In response to the write command, the switch selector 40 writes the 8-bit data 11011001 stored in the data register 60 to the data cells DC that are coupled to the word line WL15 (refer to FIG. 14A)

In this manner, the determiner 30 selects the memory core M16 as a write subject memory core, and writes the 8-bit data 11011001 to the data cells DC of the memory core M1. The write processing then advances to step S54.

In step S54, the determiner 30 determines whether the input data Din input into the command register 50 has been completely written. In this case, the input 8-bit data has been written completely. Thus, the write processing advances to step S55.

In step S55, the determiner 30 controls the switch selector 40 to write "1" to the flag cell FC that is coupled to the word line WL15, that is, the flag cell FC of the memory core M16 (refer to FIG. 14A). As a result, the memory core M16 is set as a reading start position. The data write operation ends after step S55.

The data read operation for reading the 8-bit data 11011001, which has been written to the memory core M16 (refer to FIG. 14A), will now be described.

In the data read operation, the command register 50 generates a read command in response to a read signal.

Figure 13:
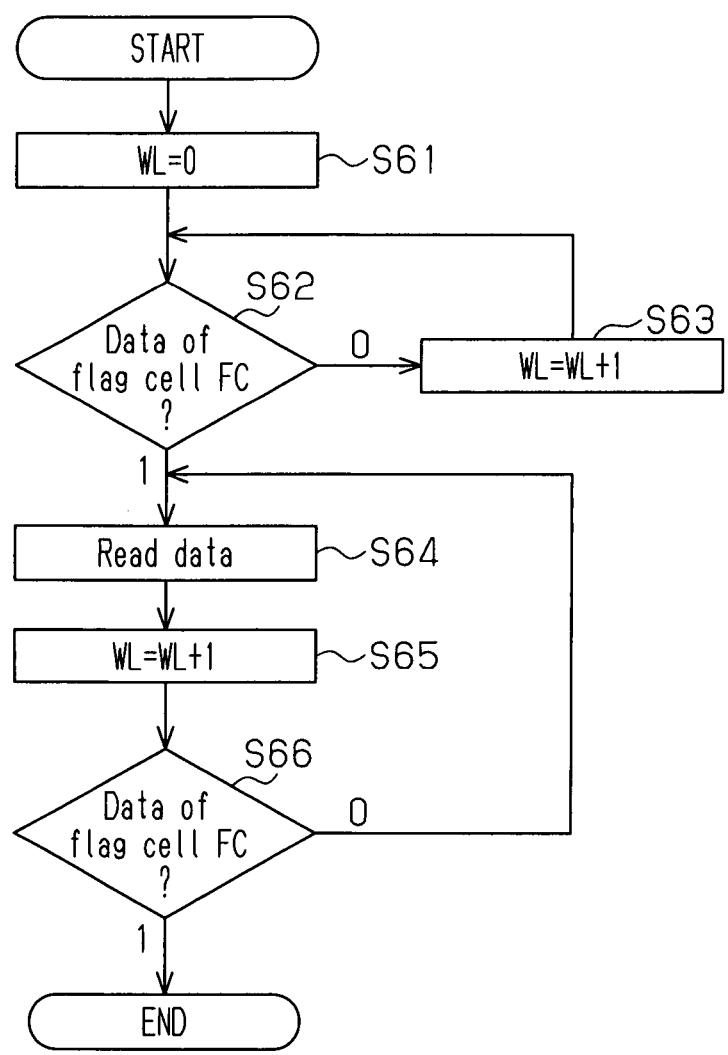
FIG. 13 is a flowchart illustrating a data read operation of the semiconductor memory device of FIG. 11.

In step S61 shown in FIG. 13, the determiner 30 provides the decoder 20 with a selection signal SS for selecting the word line WL0 in response to the read command, which is provided from the command register 50. The determiner 30 also provides the switch selector 40 with the read command. The decoder 20 selects the word line WL0 in response to the selection signal SS, which is provided from the determiner 30.

In step S62, the determiner 30 controls the switch selector 40 to read data from the flag cell FC of the memory core M1, which is coupled to the word line WL0. The determiner 30 determines whether the read data is 0 or 1. When the flag cell FC is "0", no data has been written to the data cells DC of the memory core including the flag cell FC, that is, the selected memory core is not at the reading start position. When the flag cell FC is "1", the memory core including the flag cell FC is at the reading start position. In this case, the flag cell FC of the memory core M1 is "0" (refer to FIG. 14A). Thus, the determiner 30 determines that the memory core M1 is not at the reading start position. The read processing then advances to step S63.

In step S63, the determiner 30 adds 1 to the previously selected word line number 0 to change the word line to the word line WL1, and provides the decoder 20 with a selection signal SS for selecting the word line WL1. The read processing then returns to step S62.

In step S62, the determiner 30 controls the switch selector 40 to read data from the flag cell FC of the memory core M2, which is coupled to the word line WL1. The determiner 30 determines the flag value of the flag cell FC. In this case, the flag cell FC of the memory core M2 is "0". Thus, the determiner 30 determines that the memory core M2 is not at the reading start position. The read processing then advances to step S63. Thereafter, the processing of steps S62 and S63 is repeated until the determiner 30 determines that the flag cell FC of the memory core is 1. In other words, the processing of steps S62 and S63 is repeated until the word line number is changed to that of the word line that is coupled to the reading-start-position memory core.

In this example, when the decoder 20 selects the word line WL15, the bit value 1 of the flag cell FC of the memory core M16 (refer to FIG. 14A), which is coupled to the word line WL15, is output from the switch selector 40 to the determiner 30. Then, in step S62, the determiner 30 determines that the data for the memory core M16 is 1, that is, the memory core M16 is at the reading start position. The read processing then advances to step S64.

In step S64, the switch selector 40 reads the data stored in the data cells DC of the memory core M16, which is coupled to the word line WL15, in response to a read command provided from the determiner 30 and outputs the read data as the output data Dout. As a result, the 8-bit data 11011001, which has been written to the data cells DC of the memory core M16, is output from the semiconductor memory device 4. In this manner, the memory core M16, to which the 8-bit data has been written, is selected as a read subject memory core based on the selection signal SS, which is generated by the determiner 30, and the data of the flag cell FC, which has the value of "1". The data is then read from the memory core M16. The read processing then advances to step S65.

In step S65, the determiner 30 adds 1 to the previously selected word line number 15 to change the word line. However, the word line WL15 is the last word line that can be selected in the data read operation in this example. Thus, the word line is not changed. Accordingly, the determiner 30 provides the decoder 20 with a selection signal SS for selecting the word line WL15. The read processing then advances to step S66.

In step S66, the determiner 30 controls the switch selector 40 to read data from the flag cell FC of the memory core M16, which is coupled to the word line WL15. The determiner 30 then determines whether the read data is "0" or "1". When the flag cell FC is "0", the memory core including the flag cell FC is not at the reading end position. When the flag cell FC is "1", the memory core including the flag cell FC is at the reading end position. In this case, the flag cell FC of the memory core M16 is "1" (refer to FIG. 14A). Thus, the determiner 30 determines that the memory core M16 is at the data reading end position and ends the data read operation. More specifically, the value "1" of the flag cell FC of the memory core M16 indicates the reading start position in step S62 and the reading end position in step S66 in this example.

As described above in the fourth embodiment, the determiner 30 selects the word lines in the order of the word line WL15, the word line WL14, ..., the word line WL1, and the word line WL0 during the data write operation, whereas the determiner 30 selects the word lines in the order of the word line WL0, the word line WL1, ..., the word line WL14, and the word line WL15 during the data read operation. In other words, the determiner 30 selects the word lines in opposite orders in the data write operation and in the data read operation. The word line selection orders in the data writing and read operations are irreversible.

The data write operation for further writing the 16-bit data 01110001/11101011 to the memory unit 14, in which the 8-bit data has been written to the data cells DC of the memory core M16, will now be described.

In the same manner as in the first data write operation described above, the command register 50 generates a write command in response to a write signal. The low-order 8-bit data 11101011 of the 16-bit data is stored in the data register 60 via the command register 50.

In step S51, the determiner 30 provides the decoder 20 with a selection signal SS for selecting the word line WL15. The write processing then advances to step S52.

In step S52, the determiner 30 determines whether data has been written to the memory core M16, which is coupled to the word line WL15, based on the number of write times recorded in the counter. In this state, data has already been written to the memory core M16. The write processing then advances to step S56.

In step S56, the determiner 30 changes the word line by subtracting 1 from the previously selected word line number and provides the decoder 20 with a selection signal SS for selecting the resulting word line. In this case, the determiner 30 subtracts 1 from the word line number 15 and changes the word line to the word line WL14. Then, the determiner 30 provides the decoder 20 with a selection signal SS for selecting the word line WL14. The write processing then returns to step S52.

In step S52, the determiner 30 determines that the memory core M15 coupled to the word line WL14 is blank based on the number of write times recorded in the counter. The write processing then advances to step S53.

In step S53, the switch selector 40 writes the 8-bit data 11101011 stored in the data register 60 to the data cells DC that are coupled to the word line WL14 in response to a write command provided from the determiner 30. As a result, the 8-bit data 11101011 is written to the data cells DC of the memory core M15 as shown in FIG. 14B. The write processing then advances to step S54.

In step S54, the high-order 8-bit data 01110001 of the 16-bit data (input data Din) has yet to be written completely. Thus, the determiner 30 determines that the input data Din input into the command register 50 has not yet been completely written. The write processing then advances to step S57.

In step S57, the determiner 30 subtracts 1 from the previously selected word line number 14 to change the word line to the word line WL13 and provides the decoder 20 with a selection signal SS for selecting the word line WL13. The write processing then advances to step S53. In this case, the high-order 8-bit data 01110001 of the 16-bit data from the command register 50 is stored in the data register 60.

In step S53, the switch selector 40 writes the 8-bit data 01110001 stored in the data register 60 to the data cells DC of the memory core M14, which is coupled to the word line WL13, in response to a write command provided from the determiner 30. As a result, the 16-bit data 01110001/11101011 is written to the data cells DC of the memory cores M14 and M15 as shown in FIG. 14C. The write processing then advances to step S54.

In step S54, the determiner 30 determines that the 16-bit data (input data Din) input to the command register 50 has been completely input. The write processing then advances to step S55.

In step S55, the determiner 30 controls the switch selector 40 to write "1" to the flag cell FC that is coupled to the word line WL13, that is, the flag cell FC of the memory core M14 (refer to FIG. 14C). As a result, the memory core M14 is set at the reading start position. The data write operation ends after step S55. When the memory core M14 is set as the reading start position, the memory core M16 that was previously been as the reading start position is newly set at the reading end position. This stops data reading from the memory core M16 that was previously at the data reading start position. As a result, data is not read from the memory core M16, to which the first 8-bit data has been written. Thus, the data written to the memory core M16 is virtually erased.

The data read operation for reading the 16-bit data 01110001/11101011 (refer to FIG. 14C), which has been written to the memory cores M14 and M15, will now be described.

The processing in steps S61, S62, and S63 shown in FIG. 13 is performed in the same manner as in the data read operation described above.

In this example, when the word line WL13 is selected by the decoder 20, the value "1" of the flag cell FC of the memory core M14, which is coupled to the word line WL13, is provided from the switch selector 40 to the determiner 30 as shown in FIG. 14C. Then, the determiner 30 determines that the flag cell FC of the memory core M14 is "1", that is, the memory core M14 is at the reading start position in step S62. The read processing then advances to step S64.

In step S64, the switch selector 40 reads the data stored in the data cells DC of the memory core M14, which is coupled to the word line WL13, in response to a read command provided from the determiner 30, and outputs the read data as the output data Dout. As a result, the high-order 8-bit data 01110001, which has been written to the data cells DC of the memory core M14, is output first from the semiconductor memory device 4. The read processing then advances to step S65.

In step S65, the determiner 30 adds 1 to the previously selected word line number 13 and changes the word line to the word line WL14. Then, the determiner 30 provides the decoder 20 with a selection signal SS for selecting the word line WL14. The read processing then returns to step S66.

In step S66, the determiner 30 controls the switch selector 40 to read data from the flag cell FC of the memory core M15, which is coupled to the word line WL14, and determines the flag value of the flag cell FC. In this case, the flag cell FC of the memory core M15 is "0" (refer to FIG. 14C). Thus, the determiner 30 determines that the memory core M15 is not at the data reading end position. The read processing then returns to step S64.

In step S64, the switch selector 40 reads the data stored in the data cells DC of the memory core M15, which is coupled to the word line WL14, in response to a read command provided from the determiner 30, and outputs the read data as the output data Dout. As a result, the low-order 8-bit data 11101011, which has been written to the data cells DC of the memory core M15, is output from the semiconductor memory device 4. In this manner, the eight high-order bits are read first, and then the eight low-order bits are read next. The read processing then advances to step S65.

In step S65, the determiner 30 adds 1 to the previously selected word line number 14 changes the word line to the word line WL15. Then, the determiner 30 provides the decoder 20 with a selection signal SS for selecting the word line WL15. The read processing then advances to step S66.

In step S66, the determiner 30 controls the switch selector 40 to read data from the flag cell FC of the memory core M16, which is coupled to the word line WL15, and reads the flag value of the flag cell FC. In this case, the flag cell FC of the memory core M16 is "1" (refer to FIG. 14C). Accordingly, the determiner 30 determines that the memory core M16 is at the data reading end position, and ends the data read operation.

In this manner, the flag cell FC is set at "1" when the data write operation ends. This sets the memory core including the flag cell FC at the reading start position. As a result, the memory core that has been previously set at the reading start position is automatically set at the reading end position. As a result, the data that has been readable can not longer be read and is virtually erased. This enables new data to be written to the memory core that is next to the memory core from which data has been virtually erased. In this manner, data is rewritten virtually. Only data in the range from the reading start position to the reading end position can be read. In other words, only the most-newly written data can be read.

The semiconductor memory device 4 of the fourth embodiment has the advantage described below in addition to advantage (1) of the first embodiment and advantage (3) of the third embodiment.

(4) The memory core M14 is set as the reading start position when the data write operation ends. Then, the memory core M16, which was the previous reading start position, is newly set as the reading end position. This enables the bit width of the data written to the memory unit 14 to be changed freely.

It should be apparent to those skilled in the art that the aforementioned embodiments may be embodied in many other specific forms without departing from the spirit or scope of the embodiments. Particularly, it should be understood that the embodiments may be embodied in the following forms.

Figure 15:
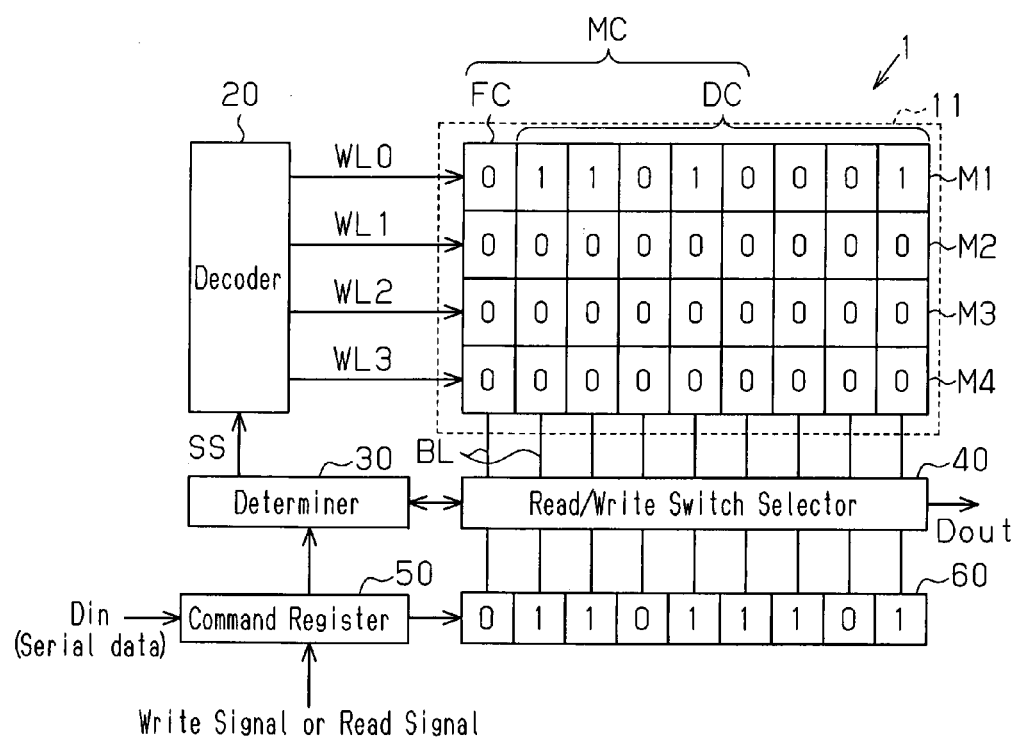
FIG. 15 is a schematic block diagram of a modified semiconductor memory device.

As shown in FIG. 15, 9-bit data, which includes a bit written to the flag cell FC, may be stored in the data register 60 as the input data Din in the first, second, and fourth embodiments in the same manner as in the third embodiment. In this case, "1" may be written to the flag cell FC based on the lowest-order bit of the input data Din.

The determiner 30 may, for example, automatically add "1" to the first flag cell FC1 and the second flag cell FC2 in the third embodiment in the same manner as in the first, second, and fourth embodiments.

In the first and fourth embodiments, the determiner 30 may determine whether the memory core is blank (steps S3 and S52) by reading the data cells DC instead of counting the number of write times. In this case, the determiner 30 determines that the memory core is blank when the data cells DC read from the memory core are all 0.

In the first, third, and fourth embodiments, the selected word wire is changed whenever new data is input. This prevents the data from being written twice to the same memory core. However, data may be written to the same memory core for a number of times. This increases the rewritable number of times for the semiconductor memory device in the above embodiments.

In the first embodiment, the processing in step S3 (refer to FIG. 2) for determining whether the memory core is blank may be modified in the following form. The determiner 30 reads first data, which has been written to the memory core (e.g. M1) selected by the decoder 20, and then compares the first data with second data, which is to be written next. When the rewrite operation includes only rewriting data cells DC from "0" to "1", that is, only rewriting data cells DC to a predetermined logic value of "1", the second data may be allowed to be written to the memory core M1. When the rewrite operation includes rewriting "1" to "0" in any of the data cells DC, that is, rewriting of the value to a logic value of 0, which is inverse to the predetermined logic value, the second data is prohibited from being written to the memory core M1. When the second data is allowed to be written to the memory core M1, the processing proceeds to step S4. In step S4, the second data is written to the memory core M1, to which the first data has been written. When the second data is not allowed to be written to the memory core M1, the processing proceeds to step S5. In step S5, the switch selector 40 writes "1" to the flag cell FC of the memory core M1. More specifically, the memory core M1 is set to be inaccessible. Afterwards, the determiner 30 writes the second data to the data cells DC of the memory core M2 that has been selected next in steps S6 and S2. In the case of the fourth embodiment, a flag cell that functions in the same manner as the flag cell in the first embodiment is necessary in addition to the flag cell FC shown in FIG. 11.

Another example of the data write operation for writing data twice to the same memory core, like the data write operation performed by the semiconductor memory device 3 of the third embodiment shown in FIG. 8 and the semiconductor memory device 1 shown in FIG. 15, will now be described with reference to FIGS. 15 and 16. In this data write operation, the input data Din includes data to be written to the flag cell FC.

The data write operation for first writing the first data 10001011 to the memory core M1 and then writing the second data 10111011 to the memory core M1 will now be described with reference to FIG. 15. In this case, the data 100010110 including the bit value of "0" (write control value) for the flag cell FC is first written to the memory core M1 through a first write operation. Next, the data 101110110 including the bit value of "0" (write control value) for the flag cell FC is written to the memory core M1 through a second write operation. As a result, the data 101110110 is written to the data cells DC of the memory core M1. The same data as the second data is written to the memory core M1. More specifically, when the rewriting from the first data to the second data includes only rewriting a predetermined logic value 1, the second data is written correctly to the memory core M1, to which the first data has been written. In this state, the user reads data that has been written to the memory core M1, and determines whether the read data and the second data are identical to each other.

Figure 16A:
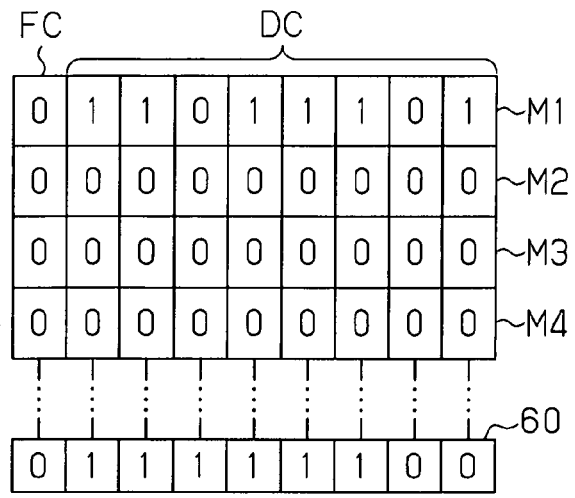
FIG. 16A is a chart illustrating the setting of flag cells shown in FIG. 15.
Figure 16B:
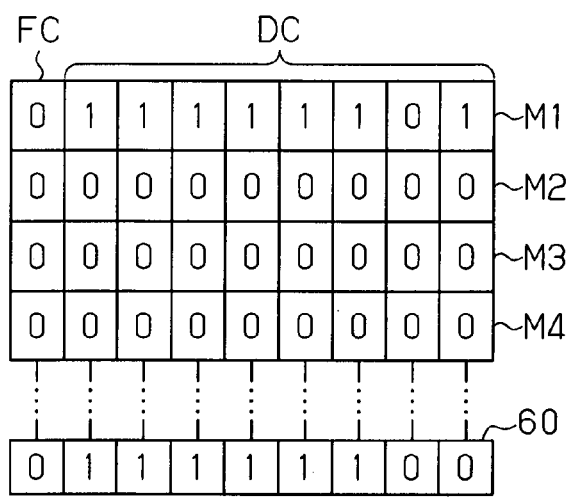
FIG. 16B is a chart illustrating the setting of the flag cells shown in FIG. 15.
Figure 16C:
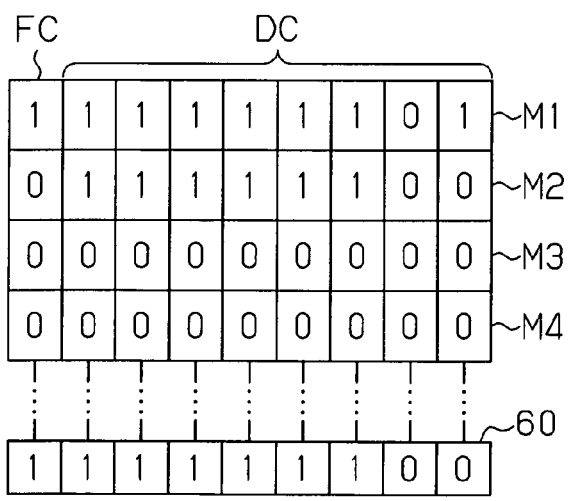
FIG. 16C is a chart illustrating the setting of the flag cells shown in FIG. 15.

The data write operation for writing the first data 10111011 to the memory core M1 and then writing the second data 00111111 to the memory core M1 as shown in FIG. 16A will now be described. In this case, the data 101110110 including the bit value of "0" (write control value) for the flag cell FC is first written to the memory core M1 through a first write operation. The data 001111110 including the bit value of "0" (write control value) for the flag cell FC is then written to the memory core M1 through a second write operation. However, the data 10111111 is written to the data cells DC of the memory core M1 as shown in FIG. 16B. In this manner, data that differs from the second data is written to the memory core M1. More specifically, when the second write operation includes rewriting to the logic value inverse to the predetermined value, that is, the logic value of 0 in even a single data cell DC, data that differs from the second data is written to the memory core M1. In this state, the user reads data that has been written to the memory core M1 and recognizes that the read data and the second data differ from each other. Then, as shown in FIG. 16C, the data 001111111 including the bit value 1 written to the flag cell FC of the memory core M1 is stored in the data register 60. Through this data writing, "1" is written to the flag cell of the memory core M1 and the memory core M1 is set to be inaccessible. As a result, the high-order 8-bit data 00111111 is written to the memory core M2, and the second data is written to the memory core M2.

In the third embodiment, the first flag cell FC1 may be used in the same manner as the flag cell FC shown in FIG. 15. This enables data to be written again to the memory core to which data has been already written. Further, the fourth embodiment may additionally use the second flag cell that functions in the same manner as the flag cell shown in FIG. 15, in addition to the flag cell FC shown in FIG. 11. This enables data to be written again to the memory core to which data has been already written.

In the third embodiment, "0" is written to the second flag cell FC2 when the data written to the memory unit 13 is 8-bit data, and "1" is written to the second flag cell FC2 when the data written to the memory unit 13 is 16-bit data. However, the bit width of the write data is not particularly limited. For example, the bit value 0 may be written to the second flag cell FC2 when the data written to the memory unit 13 is 32-bit data, and the bit value 1 may be written to the second flag cell FC2 when the write data is 64-bit data.

In the third embodiment, the flag cell for selecting the data length, that is, the second flag cell FC2, may be formed by two or more memory cells. In this case, the two second flag cells FC2 being "00" may indicate 8-bit data. The two second flags FC2 being "01" may indicate 16-bit data. The two second flags FC2 being "10" may represent 32-bit data. The two second flags FC2 being "11" may represent 64-bit data. In this manner, an increase in the number of memory cells used as the second flag cells FC2 increases the number of bit widths that can be selected.

In the above embodiments, the number of memory cores is particularly limited. The number of rewritable times may be increased as the number of memory cores increases.

In the above embodiments, the number of data cells included in each memory core is not particularly limited.

In the above embodiments, bit lines may be selected in lieu of the word lines by the selection signal SS of the determiner 30 and the data of each flag cell.

In the above embodiments, the value of "1" instead of "0" may be used to indicate that the memory cell MC is blank.

In the above embodiments, the memory cell MC may be a fused instead of a non-volatile memory that only permits program operations.

In the above embodiments, parallel data may be input or output instead of serial data.

The present examples and embodiments are to be considered as illustrative and not restrictive, and the invention is not to be limited to the details given herein, but may be modified within the scope and equivalence of the appended claims.

What is claimed is:

1. A semiconductor memory device comprising:
    a plurality of memory cores, each of which includes a plurality of non-volatile memory cells that allow a given logic value to be written, and each of which is independently accessible; and
    an access control circuit selecting an access-control subject memory core from the plurality of memory cores;
    wherein the plurality of non-volatile memory cells of each memory core include at least one flag cell storing a flag value and a plurality of data cells storing data, and the access control circuit selects the access-control subject memory core based on the flag value of the at least one flag cell in each memory core.

2. The semiconductor memory device according to claim 1, wherein:
    the access control circuit selects the access-control subject memory core during a write operation in an irreversible order and selects the access-control subject memory core during a read operation in an irreversible order that is the same as that in the write operation;
    the plurality of memory cores include a first memory core and a second memory core; and
    the access control circuit writes first data to the first memory core when selected as the access-control subject memory core, sets the first memory core to be inaccessible by writing the given logic value to the flag cell of the first memory core when the access control circuit writes second data after the first data, and writes the second data to the second memory core when selected as the access-control subject memory core after the first memory core.

3. The semiconductor memory device according to claim 1, wherein:
    the at least one flag cell in each memory core includes a first flag cell and a second flag cell;
    the access control circuit selects the access-control subject memory core during a write operation in an irreversible order, selects the access-control subject memory core during a read operation in an irreversible order that is the same as that in the write operation, and writes a flag value indicating a data bit width to the second flag cell of the access-control subject memory core selected in the write operation when data is written to the data cells of the access-control subject memory core selected in the write operation;
    the plurality of memory cores include a first memory core and a second memory core; and
    the access control circuit writes first data to the first memory core when selected as the access-control subject memory core, sets the first memory core to be inaccessible by writing the given logic value to the first flag cell of the first memory core when the access control circuit writes second data after the first data, and writes the second data to the second memory core when selected as the access-control subject memory core after the first memory core.

4. The semiconductor memory device according to claim 3, wherein:
    the first data includes a plurality of bits, and the second data includes a plurality of bits, the quantity of which is the same as that of the first data; and
    the access control circuit writes the second data to the first memory core when writing the second data includes only rewriting at least one of the bits of the first data to the given logic value, and the access control circuit sets the first memory core to be inaccessible and writes the second data to the second memory core when writing the second data includes rewriting at least one of the bits of the first data to a logic value inverse to the given logic value.

5. The semiconductor memory device according to claim 1, wherein the access control circuit selects the access-control subject memory core during a write operation in an irreversible order, selects the access-control subject memory core during a read operation in an irreversible order that is the same as that in the write operation, and sets the access-control subject memory core selected in the write operation to be data readable by writing the given logic value to the at least one flag cell of the access-control subject memory core selected in the write operation when writing data to the data cells of the access-control subject memory core selected in the write operation.

6. The semiconductor memory device according to claim 1, wherein:
    the access control circuit selects the access-control subject memory core during a write operation in an irreversible order, selects the access-control subject memory core during a read operation in an irreversible order that is opposite to that in the write operation;
    the plurality of memory cores include a first memory core and a second memory core;
    the at least one flag cell in each memory core includes a first flag cell; and
    the access control circuit sets the first memory core as a data reading start position by writing the given logic value to the first flag cell of the first memory core when writing first data to the first memory core selected as the access-control subject memory core, and sets the second memory core as the data reading start position and the first memory core as a data reading end position by writing the given logic value to the first flag cell of the second memory core selected as the access-control subject memory core when writing second data to the second memory core after the first data is written.

7. The semiconductor memory device according to claim 6, wherein
    the first data includes a plurality of bits, and the second data includes a plurality of bits, the quantity of which is the same as that of the first data;
    the at least one flag cell in each memory core includes the first flag cell and a second flag cell that differs from the first flag cell; and
    when writing the second data includes only rewriting at least one of the bits of the first data to the given logic value, the access control circuit writes the second data to the first memory core, and when writing the second data includes rewriting at least one of the bits of the first data to a logic value inverse to the given logic value, the access control circuit sets the first memory core to be unwritable by writing the given logic value to the second flag cell of the first memory core and writes the first data to a memory core selected next in an order.

8. The semiconductor memory device according to claim 1, wherein:
    the semiconductor memory device is provided with the data and a write control value setting the flag value for each flag cell in each memory core; and when the write control value is a first logic value, the access control circuit writes the data to the access-control subject memory core, and when the write control value is a second logic value, the access control circuit writes a value that sets the access-control subject memory core to be inaccessible to the at least one flag cell of the access-control subject memory core, sets another memory core to be accessible as the access-control subject memory core, and writes the data to the accessible access-control subject memory core.

9. A method for controlling a semiconductor memory device, wherein the semiconductor memory device includes a plurality of memory cores, each of which includes a plurality of non-volatile memory cells that allow a given logic value to be written and each of which is independently accessible and the plurality of non-volatile memory cells that form each memory core include at least one flag cell storing a flag value and a plurality of data cells storing data, the method comprising:
   determining a flag value for the at least one flag cell in each memory core; and
   selecting an access-control subject memory core from the plurality of memory cores based on the determination of the flag value of the at least one flag cell in each memory core.

10. The method according to claim 9, wherein the plurality of memory cores include a first memory core and a second memory core, the method further comprising:
   selecting the access-control subject memory core during a write operation in an irreversible order;
   selecting the access-control subject memory core during a read operation in an irreversible order that is the same as that in the write operation;
   writing first data to the first memory core when selected as the access-control subject memory core;
   setting the first memory core to be inaccessible by writing the given logic value to the at least one flag cell of the first memory core when writing second data after writing the first data; and
   writing the second data to the second memory core when selected as the access-control subject memory core after the first memory core.

11. The method according to claim 9, wherein the at least one flag cell include a first flag cell and a second flag cell, and the plurality of memory cores include a first memory core and a second memory core, the method further comprising:
   selecting the access-control subject memory core during a write operation in an irreversible order;
   selecting the access-control subject memory core during a read operation in an irreversible order that is the same as that in the write operation;
   writing a flag value indicating a data bit width to the second flag cell of the access-control subject memory core selected in the write operation when data is written to the data cells of the access-control subject memory core selected in the write operation;
   writing first data to the first memory core when selected as the access-control subject memory core;
   setting the first memory core to be inaccessible by writing the given logic value to the first flag cell of the first memory core when writing second data after the first data; and
   writing the second data to the second memory core when selected as the access-control subject memory core after the first memory core.

12. The method according to claim 9, further comprising:
   selecting the access-control subject memory core during a write operation in an irreversible order;
   selecting the access-control subject memory core during a read operation in an irreversible order that is the same as that in the write operation; and
   setting the access-control subject memory core selected in the write operation to be data readable by writing the given logic value to the at least one flag cell of the access-control subject memory core selected in the write operation when writing data to the data cells of the access-control subject memory core selected in the write operation.

13. The method according to claim 9, wherein the plurality of memory cores include a first memory core and a second memory core, the method further comprising:
   selecting the access-control subject memory core during a write operation in an irreversible order;
   selecting the access-control subject memory core during a read operation in an irreversible order that is opposite to that in the read operation;
   setting the first memory core as a data reading start position by writing the given logic value to the at least one flag cell of the first memory core when writing first data to the first memory core as selected to be the access-control subject memory core; and
   setting the second memory core as the data reading start position and the first memory core as a data reading end position by writing the given logic value to the at least one flag cell of the second memory core as selected to be the access-control subject memory core when writing second data to the second memory core after the first data is written.

* * * * *